United States Patent [19]
Brown

[11] Patent Number: 5,917,195
[45] Date of Patent: Jun. 29, 1999

[54] PHONON RESONATOR AND METHOD FOR ITS PRODUCTION

[75] Inventor: Thomas G. Brown, Rochester, N.Y.

[73] Assignee: B.A. Painter, III, Troutville, Va.

[21] Appl. No.: 08/393,380

[22] Filed: Feb. 17, 1995

[51] Int. Cl.$^6$ .................................................. H01L 29/15
[52] U.S. Cl. ............................... 257/22; 257/17; 257/20; 257/21; 257/97; 257/197
[58] Field of Search ................................ 257/15–19, 22, 257/94, 96, 97

[56] References Cited

U.S. PATENT DOCUMENTS

| | | |
|---|---|---|
| 4,344,984 | 8/1982 | Kaplan et al. . |
| 4,349,796 | 9/1982 | Chin et al. . |
| 4,469,977 | 9/1984 | Quinn et al. . |
| 4,505,791 | 3/1985 | Angelié . |
| 4,591,889 | 5/1986 | Gossard et al. ............................ 257/15 |
| 4,785,340 | 11/1988 | Nakagawa et al. . |
| 4,959,694 | 9/1990 | Gell ........................................ 257/19 |
| 5,012,302 | 4/1991 | Goronkin ................................. 257/15 |
| 5,061,970 | 10/1991 | Goronkin . |
| 5,144,409 | 9/1992 | Ma . |
| 5,336,901 | 8/1994 | Tsuchiya ................................. 257/96 |
| 5,436,468 | 7/1995 | Nakata et al. ........................... 257/22 |

FOREIGN PATENT DOCUMENTS

| | | |
|---|---|---|
| 55-93256 | 7/1980 | Japan . |
| A 56-164588 | 4/1982 | Japan . |
| 61-274322 | 12/1986 | Japan . |
| 63-115385 | 5/1988 | Japan . |
| A 63-115385 | 5/1988 | Japan . |
| A 63-115385 | 9/1988 | Japan . |
| 63-269573 | 11/1988 | Japan . |
| A 01 015687 | 5/1989 | Japan . |

OTHER PUBLICATIONS

Mizuno et al., "Theory of acoustic–phonon transmission in finite–size superlattice systems", vol. 45, No. 2, ISSN 0163–1829, pp. 734–741, Jan. 1, 1992.
Perera et al., "Far infrared detection with a Si–p–i interface and multilayer structures", vol. 14, No. 1, ISSN 0749–6036, pp. 123–128, 1993.
Spitzer et al., "Raman scattering by optical phonons in isotopic $^{70}(Ge)_n{}^{74}(Ge)_n$ Superlattices", vol. 72, No. 10, ISSN 0031–9007, pp. 1565–1568, Mar. 7, 1994.
Anthony et al., "Thermal Diffusivity of Isotopically Enriched $^{12}$C Diamond", Physical Review B, vol. 42, No. 2, pp. 1104–1111, Jul. 15, 1990–I.
Arai et al., "Practical Separation of Silicon Isotopes by IRMPD of $Si_2F_6$", Appl. Phys. B 53, pp. 199–202, 1991.
Berezin, "On the possibility of Isotope Ordering and Isotopic Superlattices", J. Phys. C: Solid State Phys. 20, L219–L221, 1987.
Berezin, "Isotopic Superlattices and Isotopically Ordered Structures", Solid State Communications, vol. 65, No. 8, pp. 819–821, 1988.
Berezin, "Isotopic Disorder as a Limiting Factor for the Mobility of Charge Carriers", Chemical Physics Letters, vol. 110, pp. 385–387, No. 4, Oct. 5, 1984.
Buschert et al., "Effect of Isotope Concentration on the Lattice Parameter of Germanium Perfect Crystals", Physical Review B, vol. 38, No. 8, pp. 5219–5221, Sep. 15, 1998–I.

(List continued on next page.)

*Primary Examiner*—Gene M. Munson
*Attorney, Agent, or Firm*—Brenda Herschbach Jarrell; Sam Pasternack; Choate, Hall & Stewart

[57] ABSTRACT

A structure of periodically varying density is provided, that acts as a phonon resonator for phonons capable of participating in phonon-electron interactions. Specifically, a phonon resonator that is resonant for phonons of appropriate momentum to participate in indirect radiative transitions and/or inter zone intervalley scattering events is provided. Preferably, the structure is an isotope superlattice, most preferably of silicon. The structure of the present invention has improved optical, electrical, and/or heat transfer properties. A method of preparing a the structure of the present invention is also provided.

33 Claims, 15 Drawing Sheets

OTHER PUBLICATIONS

Clark et al., "Silane Purification Via Laser–induced Chemistry", Appl. Phys. Lett, 32(1), pp. 46–49, Jan. 1, 1978.

Cohen, "Band Structures and Pseudopotential Form Factors for Fourteen Semiconductors of the Diamond and Zinc–blende Structure", Physical Review, vol. 141, No. 2, pp. 789–796, Jan. 1966.

Collins et al., "Indirect Energy Gap of $^{13}$C Diamond", vol. 65, No. 7, pp. 891–894. Aug. 13, 1990.

Döhler et al., Doping Superlattices ("n–i–p–i Crystals"), Journal of Quantum Electronics, vol. QE–22, No. 9, pp. 1682–1695, Sep. 1986.

Egami et al., "Lattice Effect of Strong Electron Correlation: Implication for Ferroelectricity and Superconductivity", Science, vol. 261, pp. 1307–1310, Sep. 3, 1993.

Epling et al., "Isotope Enrichment by Photolysis on Ordered Surfaces", J. Am. Chem. Soc. 1981, 103, pp. 1238–1240, 1981.

Esaki et al., "A Bird's–Eye View on the Evolution of Semiconductor Superlattices and Quantum Wells", Journal of Quantum Electronics, vol. QE–22, No. 9, pp. 1611–1624, Sep. 1986.

Etchegoin et al. "Phonons in isotopically disorded Ge" Physical Review B, vol. 48, No. 17, Nov. 1, 1993–I.

Fuchs et al., "Anharmonic Decay Time, Isotopic Scattering Time, and Inhomogeneous Line Broadening of Optical phonons in $^{70}$Ge, $^{76}$Ge, and natural Ge Crystals", Physical Review B, vol. 44, pp. 8633–8642, No. 16, Oct. 15, 1991–II.

Fuchs et al., "Infrared Absorption in $^{76}$ Ge and Natural Ge Crystals: Effects of Isotopic Disorder on q=o Phonons", Physical Review B, vol. 45, pp. 4065–4070, No. 8, Feb. 15, 1992–II.

Fuchs et al., "Isotopic Ge Superlattices: Vibrational Properties", Superlattices and Microstructures, vol. 13, No. 4, pp. 447–4581993.

Haller, "Semiconductor Isotope Engineering", LBL–34279, Preprint. Proc. GADEST '93, Gettering and Defect Engineering in Semiconductors, Klingemühle, Germany, Oct. 9–14, 1993.

Hass et al., "Effects of Isotopic Disorder on the Phonon Spectrum of Diamond", Physical Review B, vol. 44, pp. 12046–12176, No. 21, Dec. 1, 1991–I.

Itoh et al., "High Purity Isotopically Enriched $^{70}$ Ge and $^{74}$ Ge single crystals: Isotope Separation, Growth, and Properties", vol. 8, No. 6, Jun. 1993.

Iyer et al., "Light Emission from Silicon", Science, vol. 260, pp. 40–46, Apr. 2, 1993.

Kamioka et al., "Isotope–Selective Infrared Multiple Photon Decompostion of Hexafluorodisilane", J. Phys. Chem., 90, pp. 5727–5730, 1986.

Klein, "Phonons in Semiconductor Superlattices", IEEE Journal of Quantum Electronics, vol. QE–22, No. 9, pp. 1760–1770, Sep. 9, 1986.

Koblinger et al., "Phonon Stop Bands in Amorphous Superlattices", Physical Review B, vol. 35, No. 17, pp. 9372–9375, Jun. 125, 1987–I.

Liu et al., "A RHEED Study of the Surface Reconstructions of Si(001) During Gas Source MBE Using Disilane", Surface Science 264, pp. 301–311, 1992.

Lyman et al., "Enrichment of Boron, Carbon, and Silicon Isotopes by Multiple–Photon Absorption of 10.6$\mu$m Laser Radiation", Journal of Applied Physics, vol. 47, No. 2, pp. 595–601, Feb. 1976.

Nieminen, "Hydrogen Atoms Bond Together", Nature, vol. 356, pp. 289–290, Mar. 26, 1992.

Nilsson et al., "Study of the Homology between Silicon and Germanium by Thermal–Neutron Spectrometry", Physical Review B, vol. 6, No. 10, Nov. 15, 1972.

Olander, "The Gas Centrifuge", Scientific American, vol. 239, No. 2, pp. 37–43, Aug. 1978.

Presting et al., "Ultrathin $Si_mGe_n$ Strained Layer Superlattices–a Step Towards Si Optoelectronics", Semicond. Sci. Technol. 7, pp. 1127–1148, 1992.

Sedgwick et al., "Atmospheric Pressure Chemical Vapor Deposition of Si and SiGe at Low Temperatures", J. Vac. Sci. Technol. A 10(4), pp. 1913–1919, Jul./Aug. 1992.

Spitzer et al., Raman Scattering by Optical Phonons in Isotopic $^{70}(Ge)_n$ $^{74}(Ge)_n$ Superlattices, Physical Review Letters, vol. 72, pp. 1565–1568, No. 10, Mar. 7, 1994.

Wilkinson et al., "Infrared Spectra of Some $MH_4$ Molecules", The Journal of Chemical Physics, vol. 44, No. 10, pp. 3867–3871, May 15, 1966.

Zollner et al., "Isotope and Temperature Shifts of Direct and Indirect Band Gaps in Diamond–Type Semiconductors", Physical Review B, vol. 45, No. 7, pp. 3376–3385, Feb. 15, 1992–I.

PHONON RESONATOR AND METHOD FOR ITS PRODUCTION

BACKGROUND OF THE INVENTION

Semiconducting materials have proven to be the cornerstone of the electronics revolution; and silicon, thanks to its purity, ease of fabrication, and high yield in manufacturing, has been the dominant material utilized in integrated circuit technology. With the constant pressure for faster, more efficient devices, there is much interest in developing or identifying new, low-cost materials that can meet the interconnect demands associated with increasing parallelism and higher data rates. Additionally, pressure to reduce device size and density has focused efforts on identifying materials with improved heat dissipation and/or electrical conductivity characteristics.

The use of superconducting materials, in combination with established semiconductor technologies, has been proposed as a solution to the heat dissipation problems encountered with present-day semiconducting materials. Specifically, it has been suggested that superconducting wires and junctions could be used in integrated circuits to reduce heat dissipation. Unfortunately, even recently-discovered "high temperature" superconductors do not operate above cryogenic temperatures. Moreover, the expense and engineering difficulty associated with integration of available superconducting and semiconducting technologies make this possibility impractical, if not infeasible.

Optical communication systems offer a potential solution to the interconnect problem, but development efforts have been hampered by the difficulties associated with integrating efficient light sources into available silicon circuits. Silicon itself, like the other members of its periodic-table family (group IV), has limited optical capabilities due to its centrosymmetric crystal structure and an indirect band gap, which prohibits photon emission via efficient, band-to-band radiative transmission (see below).

Much effort has been directed at circumventing the selection rules that forbid band-to-band radiative transmission in indirect bandgap semiconductors, in order to develop semiconducting materials with improved optical properties (Iyer et al. Science 260:40–46, 1993). One approach has been to introduce suitable impurities into the group IV lattice. Tight binding of an exciton (an electron-hole pair) to an impurity can provide efficient radiative transmissions if a sufficient volume of impurities has been introduced. The most successful of these efforts have involved isoelectronic complexes and the rare-earth dopant Erbium. However, Erbium, like other radiative impurity complexes, is difficult to introduce in a concentration sufficient to provide optical gain.

Efforts have also been directed at growing ordered alloys and superlattices, with the idea of using band gap engineering to "fold" the Brillouin zone and achieve a quasi direct-gap material (Presting et al. Semicond. Sci. Technol. 7:1127–1148, 1992). The most popular of these materials systems has been silicon-germanium, with some recent interest in the quaternary alloy carbon-silicon-germanium-tin. These materials have yet to show the radiative efficiency found in direct bandgap materials.

A widely studied (but poorly understood) mechanism for light emission occurs in silicon that has undergone an electrochemical etching process (Iyer et al. supra). The etch produces a porous structure with nanometer-size particles that, upon passivation, provides efficient, visible photoluminescence. Samples of etched silicon have also been excited in electroluminescence, and have attracted some interest for display devices.

In addition, LEDs have been fabricated using silicon carbide. However, it has not been possible to produce optical amplifiers (e.g. lasers) using indirect bandgap materials for a discussion of the underlying reasons.

Thus, there is a need for development of materials with improved optical, electronic, and/or heat dissipation properties. There is a particular need for improved semiconductor materials. Preferably, the improved materials should be compatible with present-day electronic materials (e.g. silicon).

SUMMARY OF THE INVENTION

The present invention provides an improved material in which optical, electronic, and/or heat dissipation characteristics are modified because certain electron-phonon interactions are enhanced or suppressed in the material. Specifically, the present invention provides an indirect bandgap material that functions as a resonator for phonons of desired wavenumbers. In some embodiments, the phonon resonator of the present invention displays increased photon emission or absorption capability relative to known indirect bandgap materials. In other embodiments, the present phonon resonator has enhanced electrical properties, such as electrical conductivity. The phonon resonator of the present invention can also show improved thermal conductivity characteristics, and can be incorporated into electronic devices to provide improved heat transfer. The present invention also provides an isotope superlattice that is a phonon resonator.

The phonon resonator of the present invention can be incorporated into any of a variety of different optical devices such as, for example, LEDs and lasers. The present phonon resonator can be utilized, for example, in optical communications, data storage, printing, uv-light emission, infrared lasers, etc. Other embodiments of the phonon resonator of the present invention have enhanced electrical conductivity and can be utilized in electrical applications such as, for example, superconducting applications.

The present invention also provides methods of fabricating an isotope superlattice that is a phonon resonator.

In some embodiments, the phonon resonator of the present invention is a structure of substantially periodically varying density, which structure comprises at least one first region of a first density; and at least one second region of a second density, the first and second regions being adjacent one another and alternating in the structure so that the structure has a substantially periodically varying density. The period of the structure is selected such that the structure is substantially resonant for phonons of appropriate wavevector to participate in electron-phonon interactions (e.g. phonons of appropriate wavevector to participate in radiative electronic transitions, phonons of appropriate wavevector to participate in interzone and/or intervalley scattering of conduction band electrons).

In other embodiments, the phonon resonator of the present invention is a structure having degenerate conduction band valleys and substantially periodic variations in material composition so that scattering of electrons between the degenerate conduction band valleys is enhanced relative to intervalley electron scattering in a structure that lacks the substantially periodic variations.

In some embodiments, the density or material composition of the structure varies periodically in more than one dimension; in other embodiments, each region comprises a layer, so that the density or material composition of the structure varies periodically in only one dimension.

In preferred embodiments of the present invention, the phonon resonator is a layered structure comprising an isotope superlattice in which each layer is enriched for one isotope of an element. Most preferably, the layers are enriched for different isotopes of the same element, preferably silicon. In some preferred embodiments of a silicon isotope superlattice of the present invention, the superlattice has a period that is an integer multiple of five atomic layers; in alternate preferred embodiments, the period is an integer multiple of ten atomic layers.

The phonon resonator of the present invention, in some embodiments, is also resonant for (directional or coherent) phonons that are generated by stimulated phonon emission, so that the resonator provides accelerated heat transfer. In some embodiments, the phonon resonator provides a stochastic phonon resonance.

The present invention also provides various devices incorporating a phonon resonator. The invention provides, among other things, a light-emitting device, comprising a phonon resonator, a first electrode disposed on a first side of the structure; and a second electrode disposed on a second side of the structure, the second side being opposite the first side. At least one of the electrodes can be transparent if desired. The light-emitting device of the present invention can include a p-doped region and an n-doped region, and may function as a light-emitting diode (LED). The p- and n-doped regions of the light-emitting device of the present invention may have a higher bandgap than does the phonon resonator, so that electrons and holes are confined within the phonon resonator. The light-emitting device of the present invention preferably includes a dielectric waveguide, most preferably formed by the p-doped region and the n-doped region, each having a refractive index higher than that of the structure. In some embodiments, the light-emitting device of the present invention is a laser (e.g. a cleaved facet reflection, distributed feedback, and/or vertical cavity surface emitting).

The present invention also provides devices selected from the group consisting of light emitting devices, light emitting diodes, laser diodes, cleaved facet reflection lasers, distributed feedback lasers, vertical cavity surface emitting lasers, optical detectors, optical modulators, non-linear optical devices, electrical conductors, planar transformers, diodes, bipolar transistors, field-effect transistors, integrated circuits, SQUIDs, Josephson junctions, transducers, and microwave detectors, that are improved over conventional devices because they incorporate a phonon resonator that is substantially resonant for phonons of appropriate wavevector to participate in phonon-electron interactions.

The present invention also provides a method for producing a phonon resonator comprising the step of producing a structure of substantially periodically varying density comprising at least one first region or layer of a first density; and at least one region or second layer of a second density, the first and second regions or layers being adjacent one another and alternating in the structure so that the structure has a substantially periodically varying density, the period of the structure being selected such that the structure is substantially resonant for phonons of appropriate wavevector to participate in electron-phonon interactions. In preferred embodiments, the method of the present invention involves producing an isotope superlattice by separating isotopes; and assembling the superlattice. According to the present invention, isotope separation is preferably performed by a method selected from the group consisting of distillation, extraction, centrifugation, diffusion, electrochemical methods, and electromagnetic methods; assembly of an isotope superlattice is preferably performed by a method selected from the group consisting of: chemical vapor deposition, molecular beam epitaxy, and chemical beam epitaxy. In some embodiments, the steps of separating and assembling are performed separately. In alternate embodiments, the steps of separating and assembling are performed simultaneously. In preferred embodiments, an isotope superlattice of the present invention is produced using laser-assisted chemical vapor deposition.

DESCRIPTION OF THE PREFERRED EMBODIMENTS

Drawings

Figure 4A:
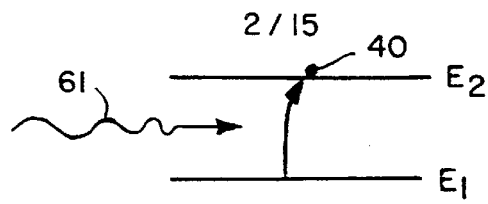
Figure 4B:
Figure 4C:

FIG. 4 illustrates the three possible photon-electron interactions. Specifically, FIG. 4A illustrates absorption of a photon by an electron that can occupy one of only two energy states; FIG. 4B illustrates spontaneous emission of a photon by an electron that can occupy one of only two energy states; and FIG. 4C illustrates stimulated emission of a photon by an electron that can occupy one of only two energy states.

Figure 5:
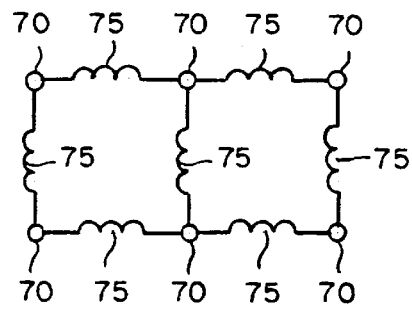

FIG. 5 is a schematic diagram of atoms arranged in a crystalline solid.

Figure 6A:
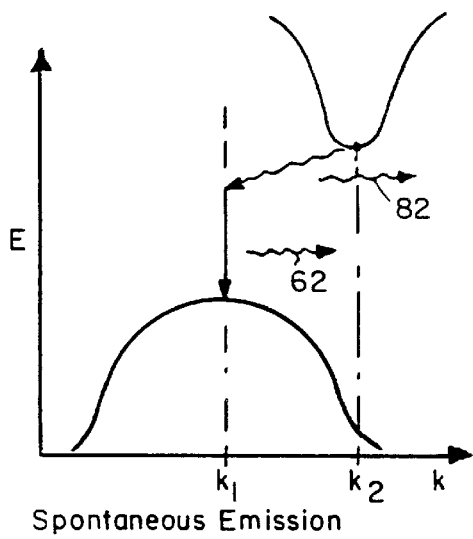
Figure 6B:
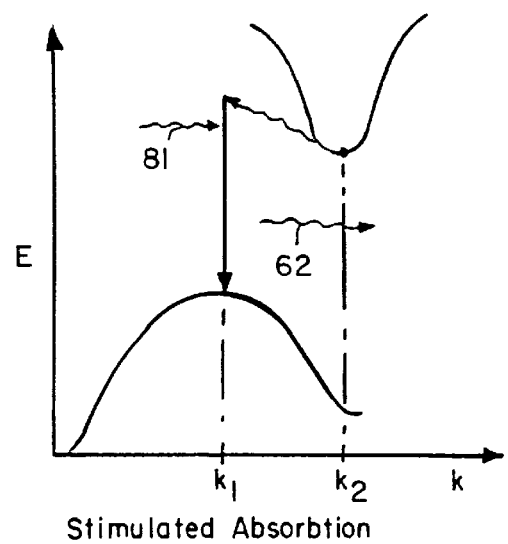
Figure 6C:
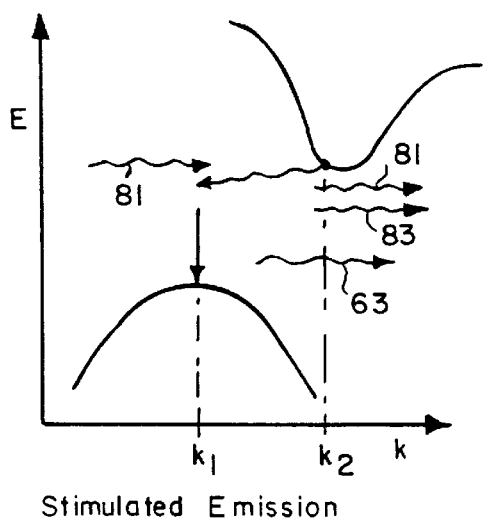

FIG. 6 depicts phonon-assisted radiative transitions in an indirect bandgap material. FIG. 6A illustrates spontaneous emission of a phonon as a result of an electron-phonon interaction that stimulates photon emission; FIG. 6B illustrates stimulated phonon absorption; and FIG. 6C illustrates stimulated phonon emission.

Figure 7:
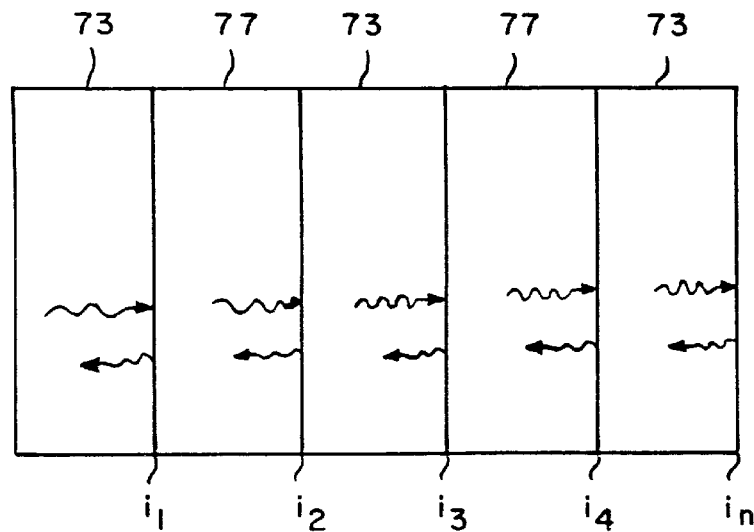

FIG. 7 is a schematic design of a distributed feedback laser.

Figure 8:
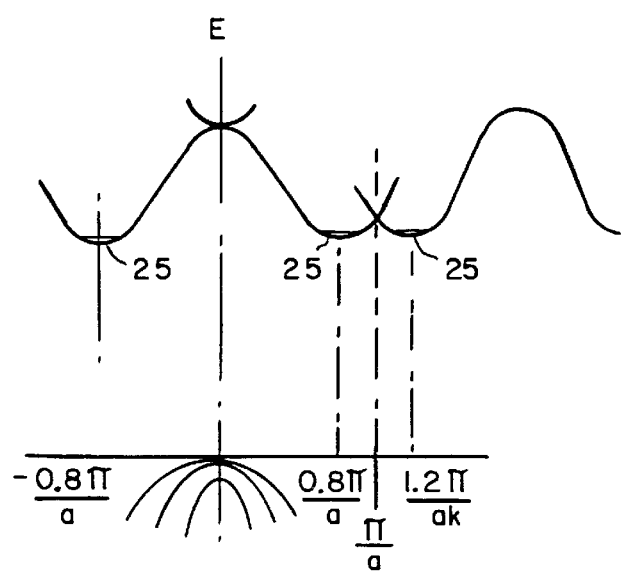

FIG. 8 is an energy vs. momentum diagram for silicon.

Figure 9:
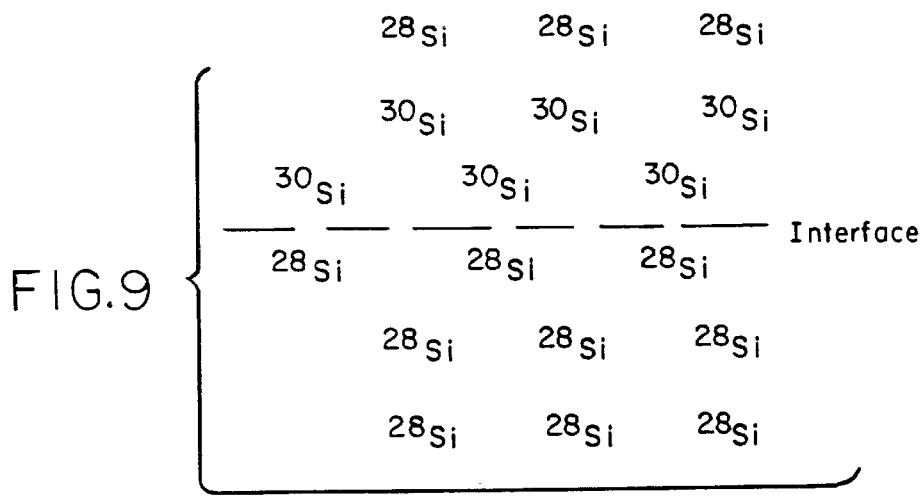

FIG. 9 shows a schematic diagram of a portion of a silicon isotope superlattice of the present invention.

Figure 10:
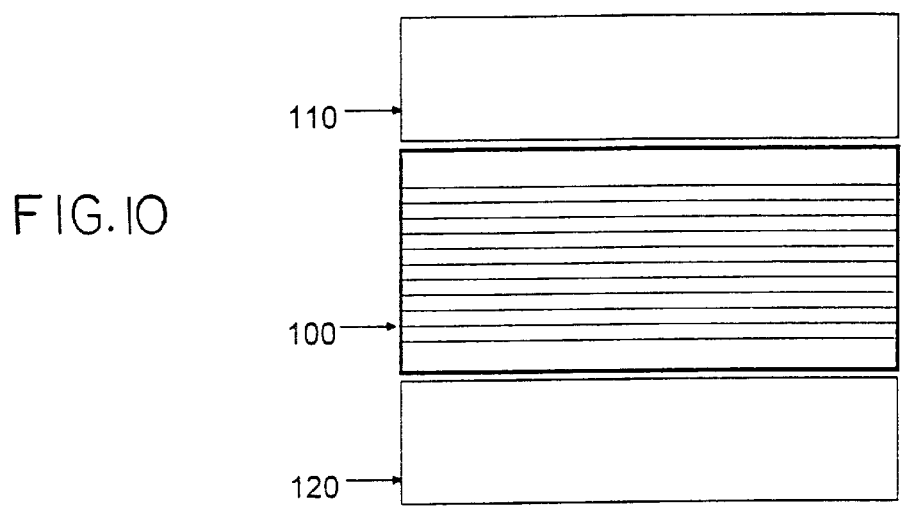

FIG. 10 illustrates a light emitting device that utilizes a phonon resonator of the present invention.

FIG. 11 presents four embodiments (as FIGS. 11A, 11B, 11C, and 11D) of a light-emitting device of the present invention.

Figure 12:
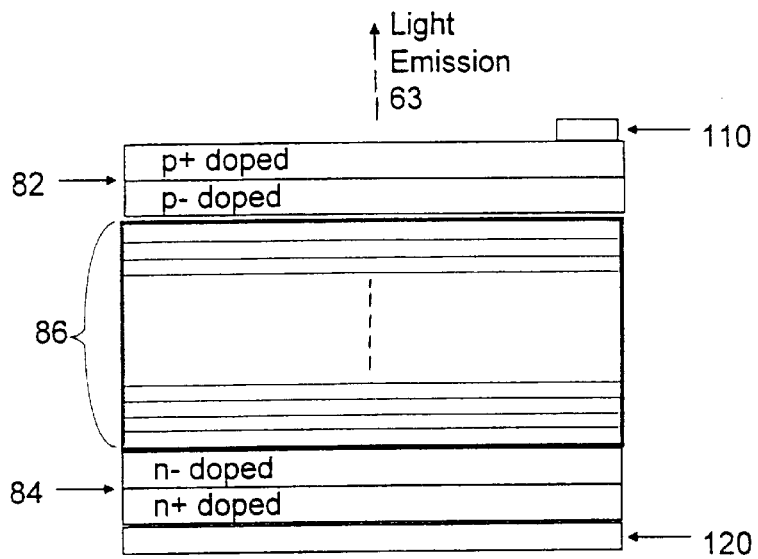

FIG. 12 depicts a light-emitting diode (LED) of the present invention.

Figure 13:
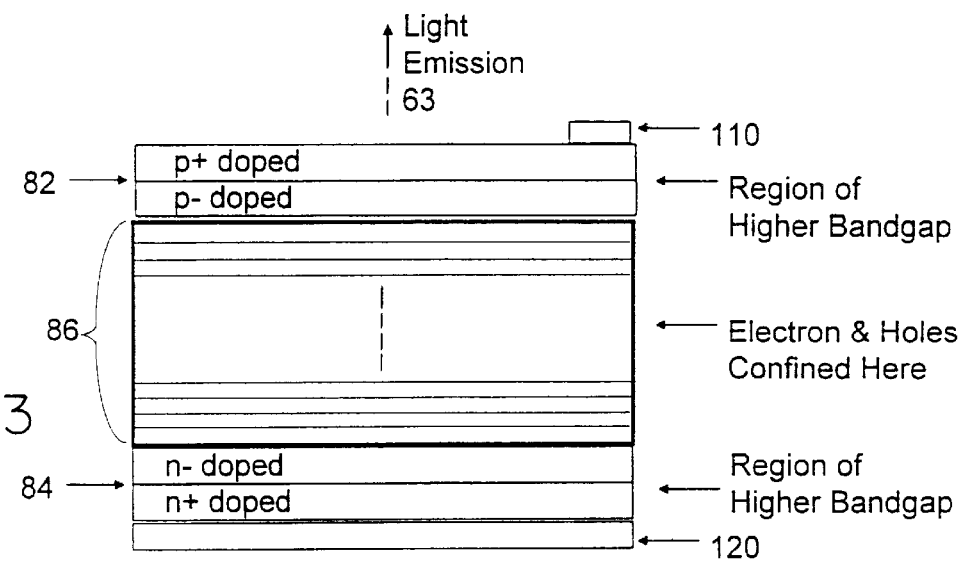

FIG. 13 depicts an LED of the present invention in which carrier confinement is achieved by means of a heterojunction.

Figure 14:
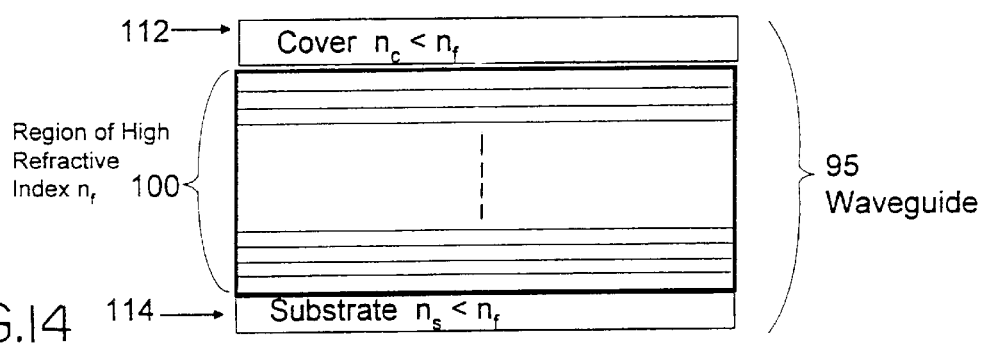

FIG. 14 depicts and edge-emitting LED of the present invention.

Figure 15A:
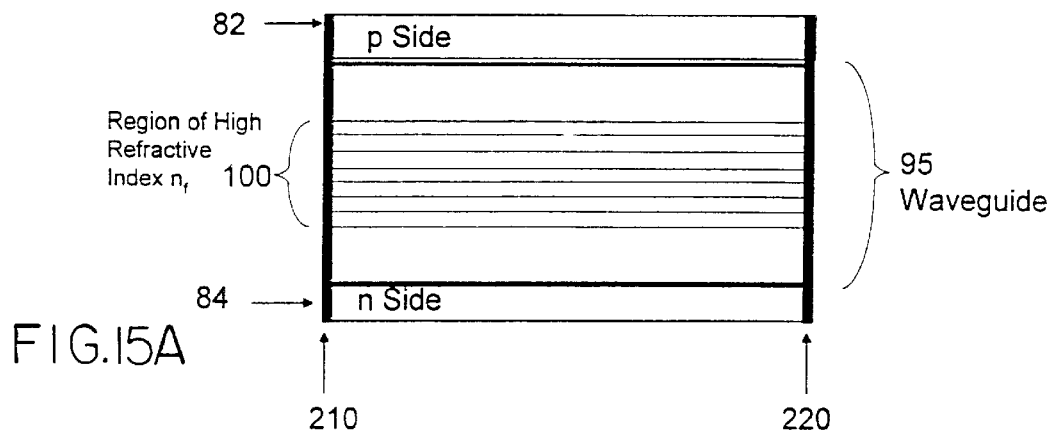
Figure 15B:
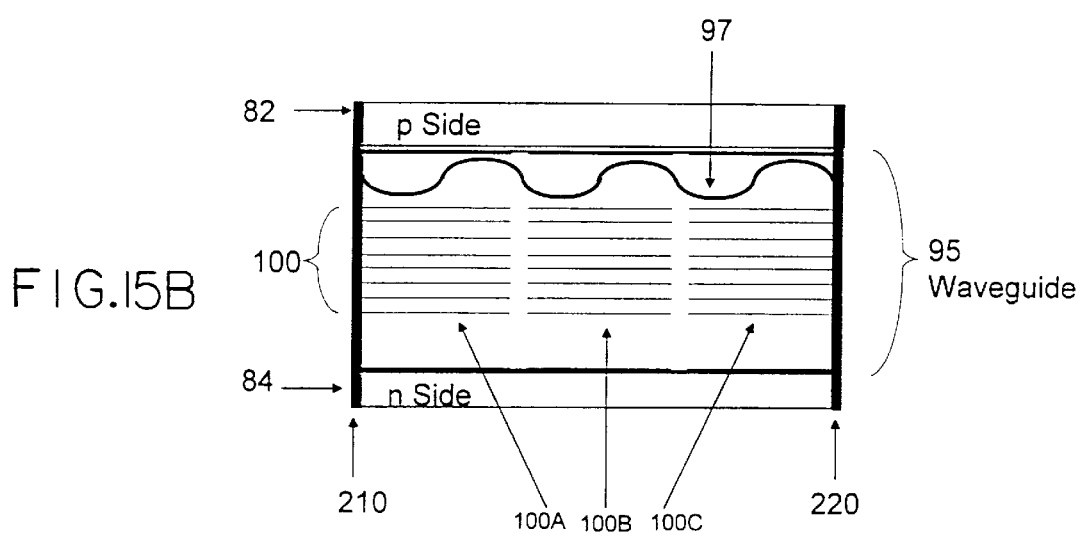

FIG. 15 presents two embodiments (as FIGS. 15A and 15B) of a laser diode of the present invention. FIG. 15A depicts a cleaved facet reflection laser. FIG. 15B depicts a distributed feedback laser.

Figure 16:
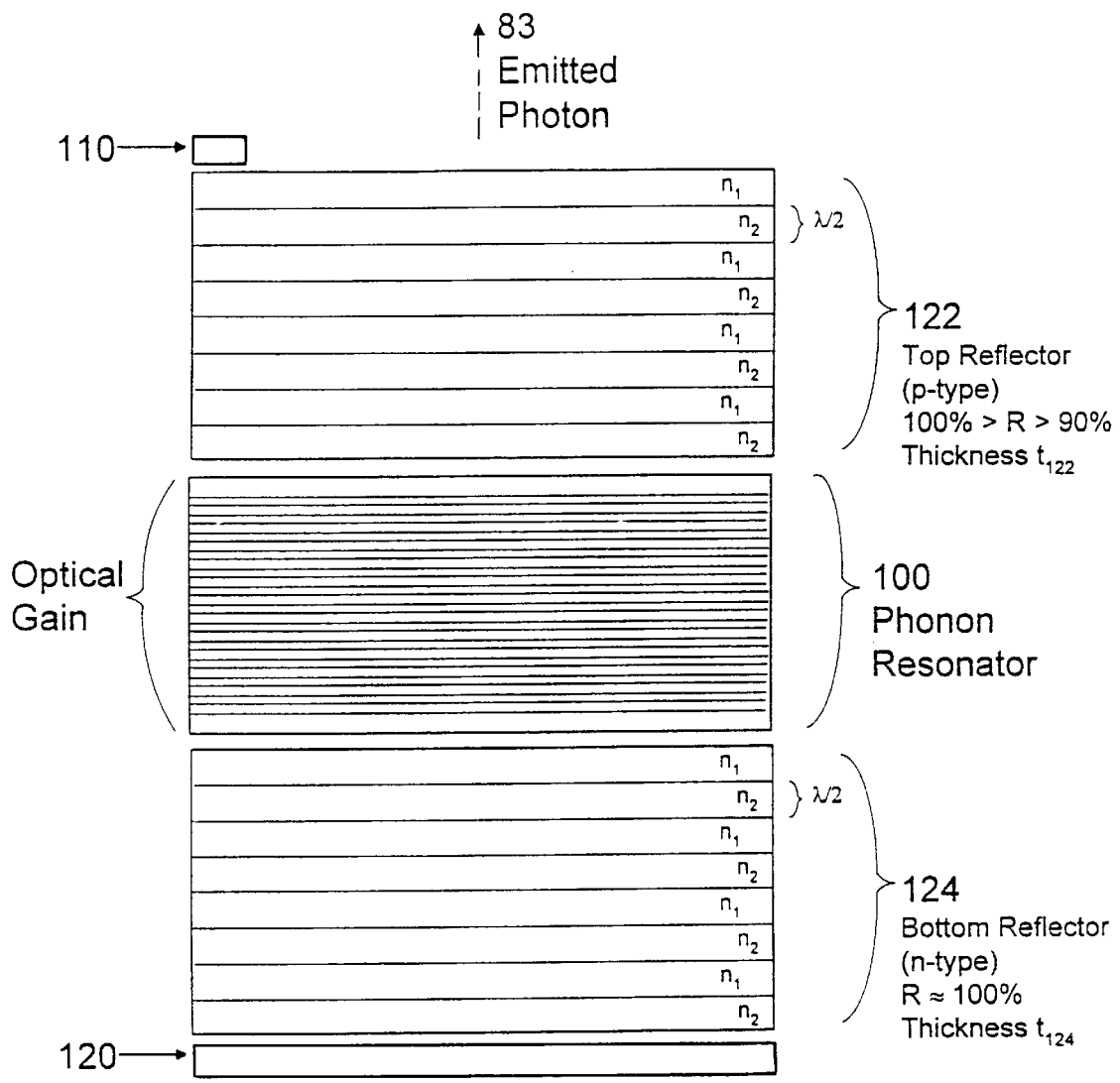

FIG. 16 depicts a Vertical Cavity Surface Emitting Laser (VECSEL) of the present invention.

Figure 17:
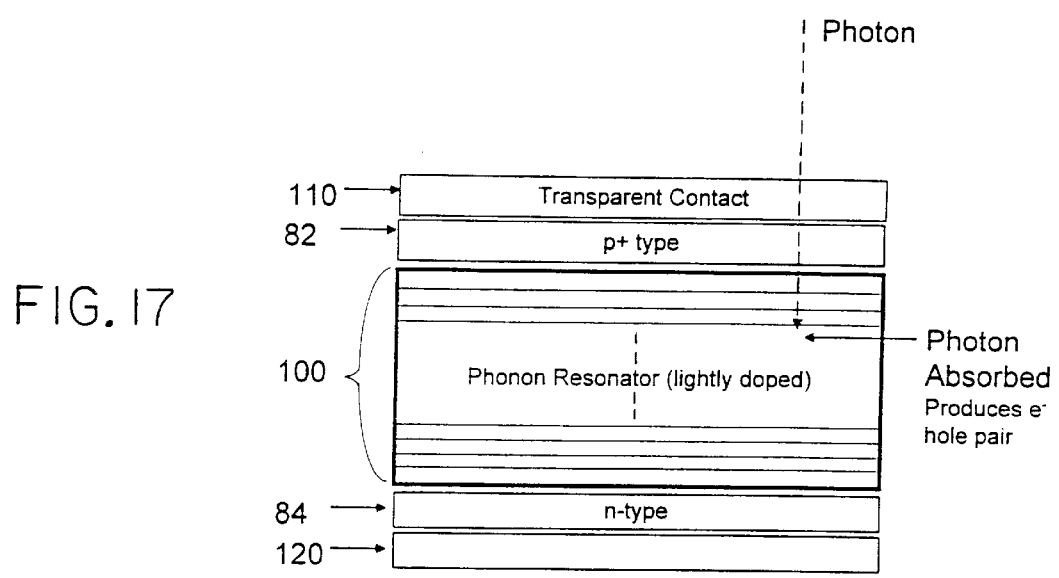
Figure 18:
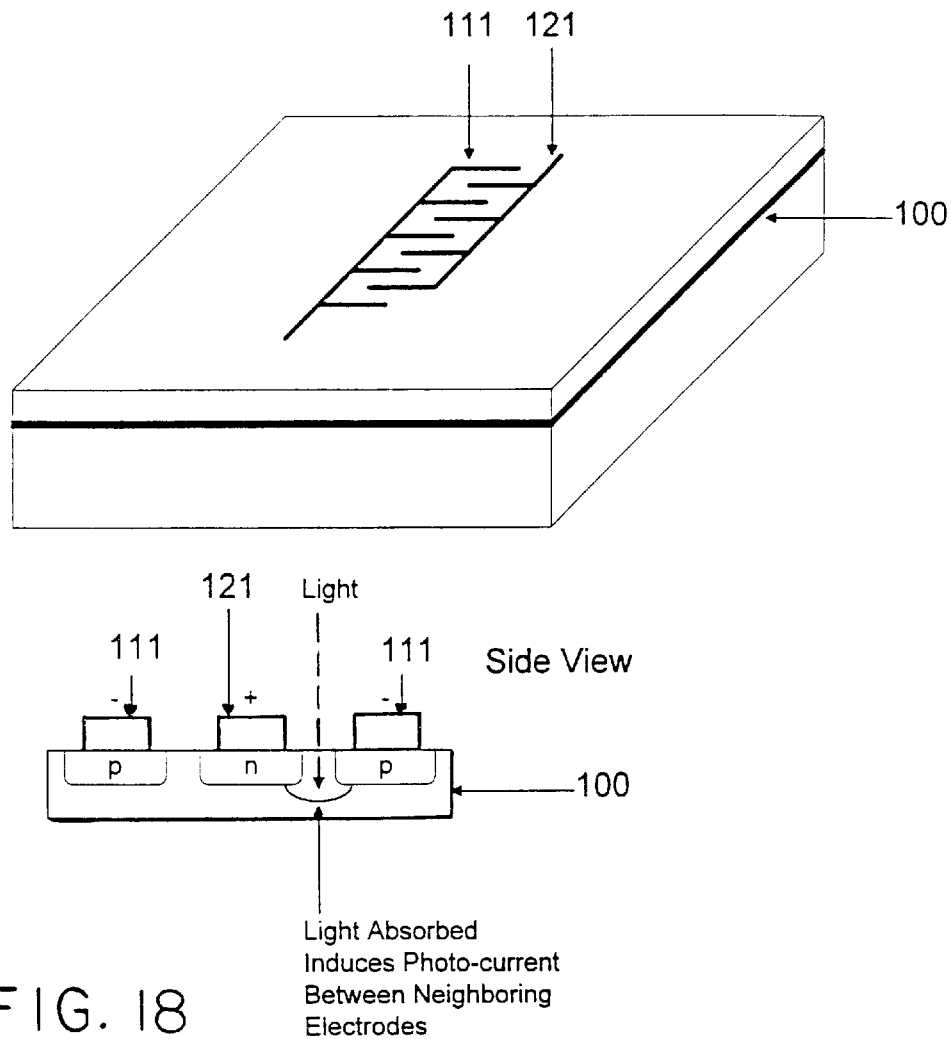

FIGS. 17 and 18 depict alternate embodiments of an optical photodetector incorporating a phonon resonator of the present invention.

Figure 19:
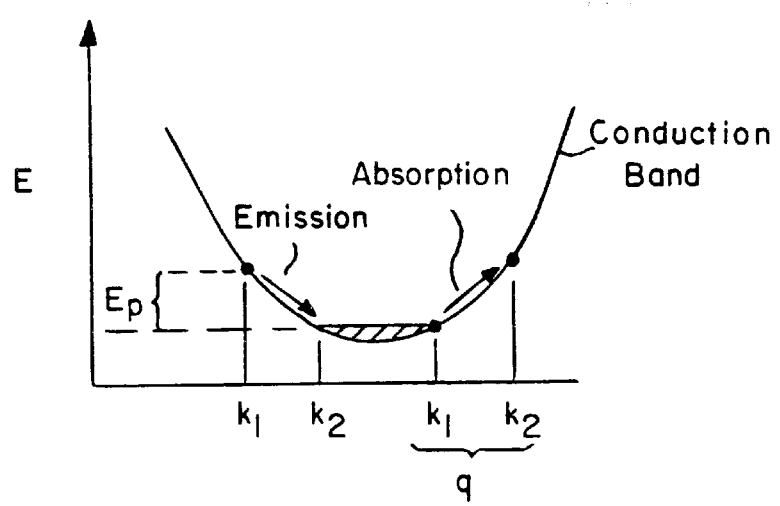

FIG. 19 depicts absorption and emission of a phonon by a conduction-band electron in a semiconductor material.

Figure 20:
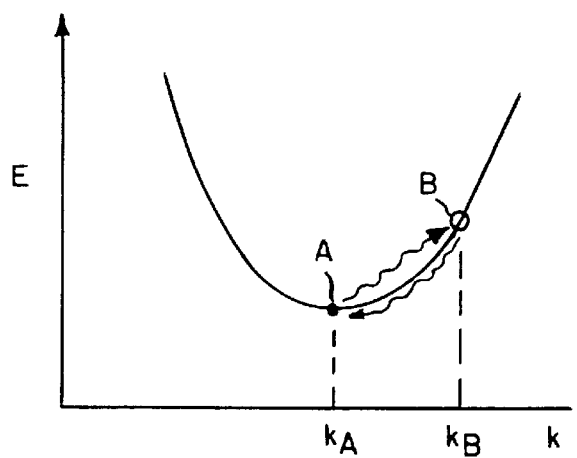

FIG. 20 depicts coherent absorption and emission of a phonon by a conduction-band electron in a semiconductor material.

Figure 21:
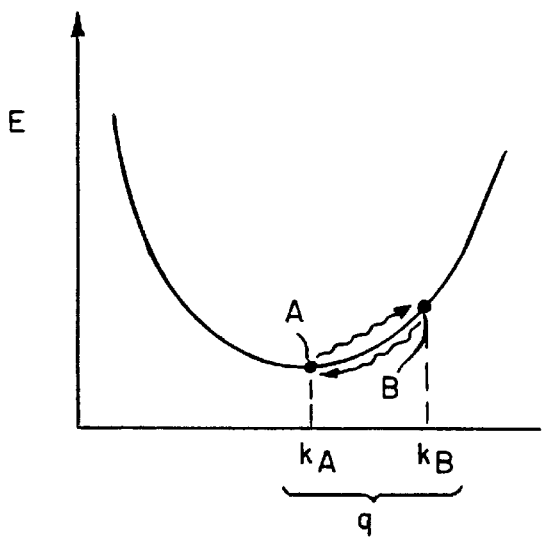

FIG. 21 illustrates phonon-mediated exchange between two conduction-band electrons in a semiconductor solid.

Figure 22:
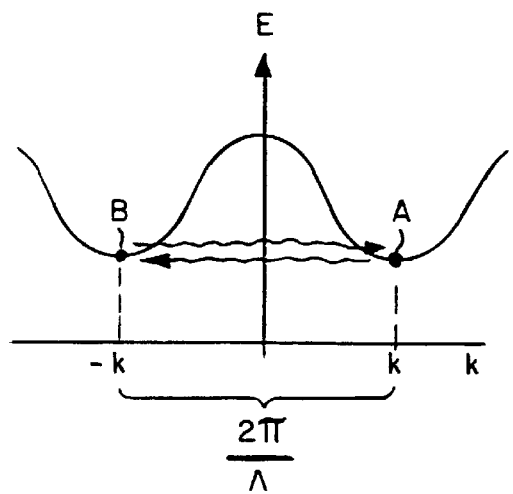

FIG. 22 illustrates phonon-mediated exchange between electrons in different, degenerate conduction band minima in a single conduction band of a semiconductor material.

Figure 23:
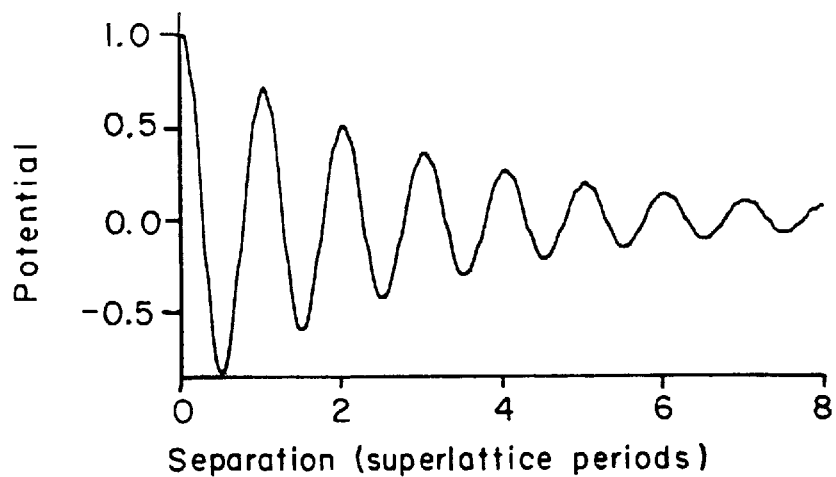

FIG. 23 presents a graph of the normalized electron pair potential as a function of the pair separation, measured in superlattice periods. For the calculation presented, the mean free path is 5 superlattice periods.

Figure 24:
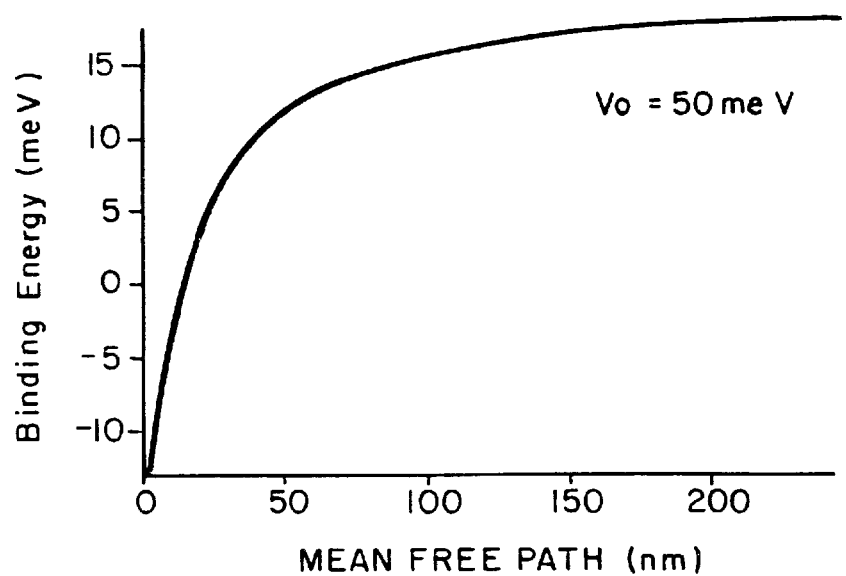

FIG. 24 is a graph showing the reduction in electron pair binding energy that occurs with decreasing electron mean free path.

Figure 25A:
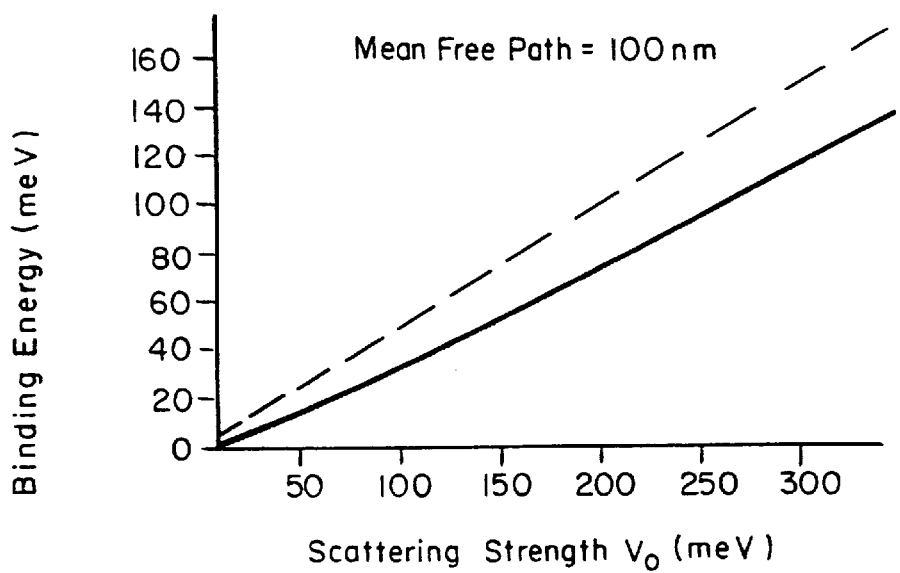
Figure 25B:
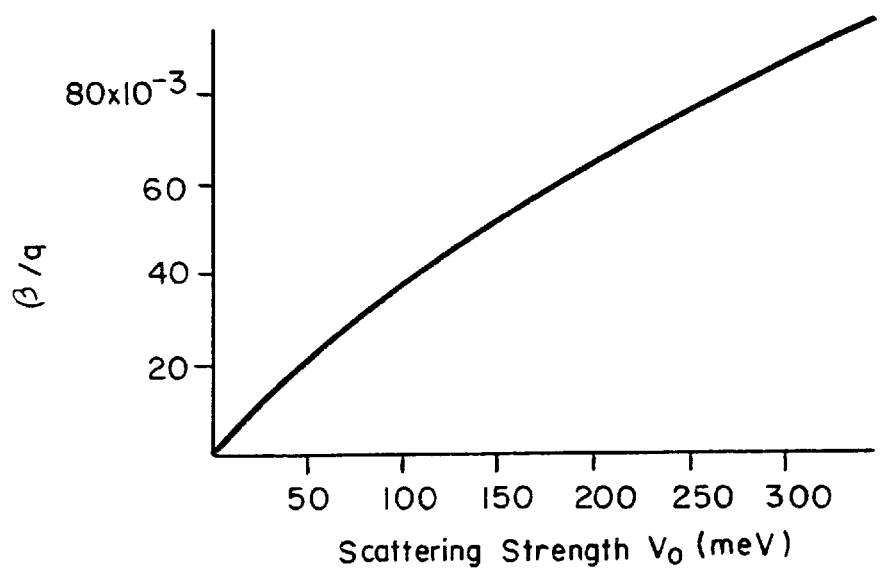

FIG. 25 shows the electron pair binding energy as a function of the scattering potential for a fixed mean free path.

Figure 26:
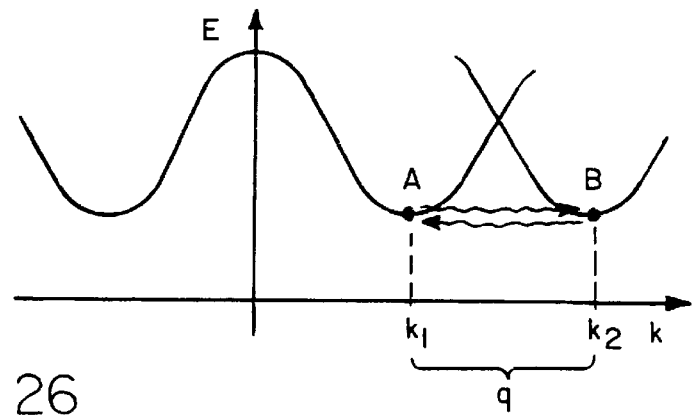

FIG. 26 depicts intervalley scattering of electrons in conduction band minima of neighboring Brillouin zones.

Figure 27:
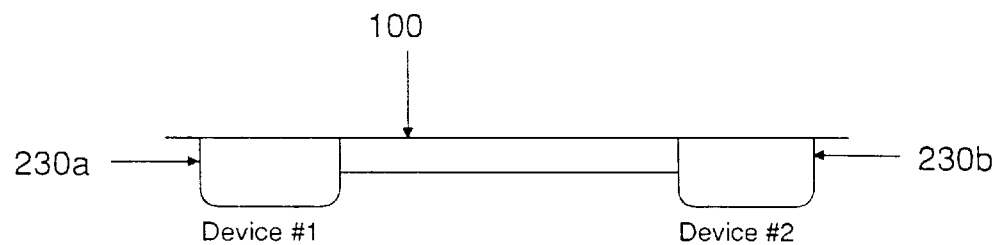

FIG. 27 shows a low-resistance electrical conductor of the present invention.

Figure 28:
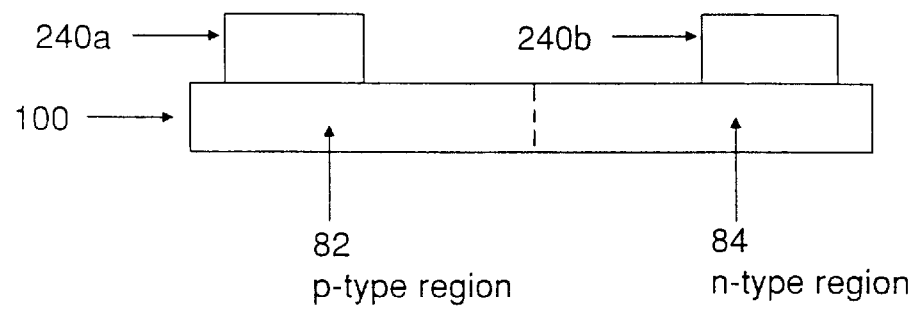

FIG. 28 depicts an electrical diode of the present invention.

Figure 29:
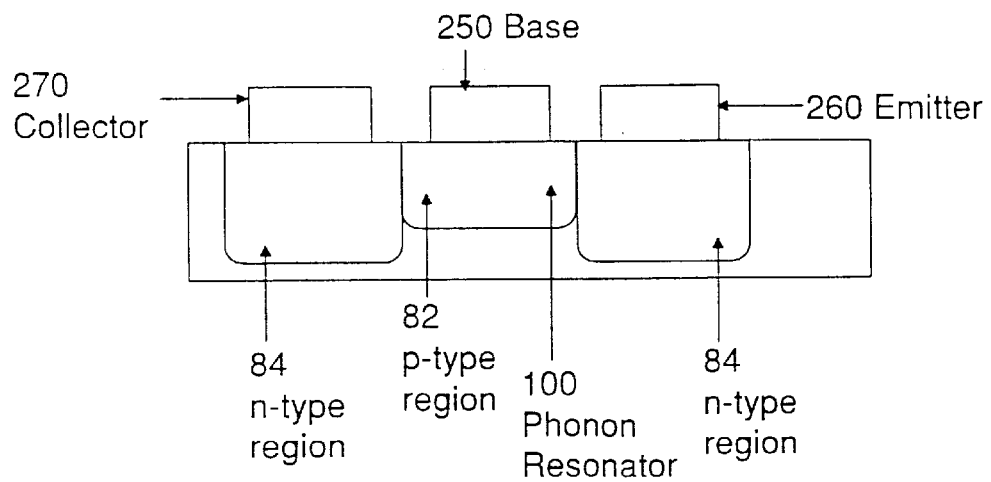

FIG. 29 depicts a bipolar transistor of the present invention.

Figure 30:
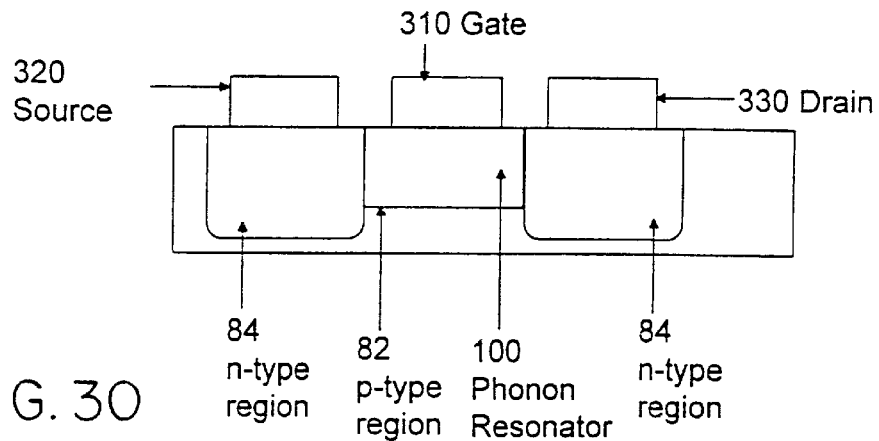

FIG. 30 depicts an n-type Junction Field Effect Transistor (JFET) of the present invention.

Figure 31:
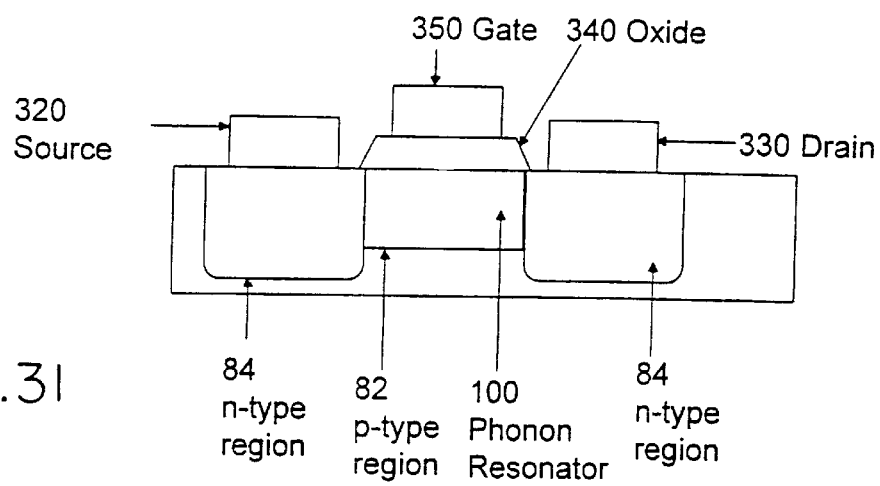

FIG. 31 depicts a Metal Oxide Semiconductor Field Effect Transistor (MOSFET) of the present invention.

Figure 32:
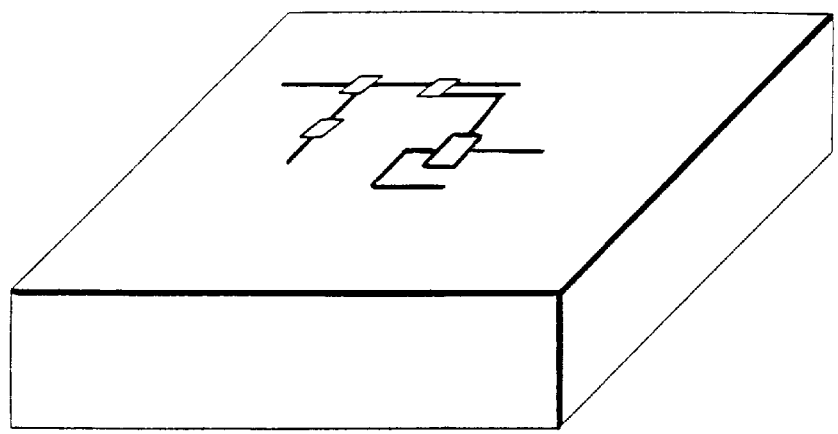

FIG. 32 depicts an integrated circuit of the present invention.

Figure 33:
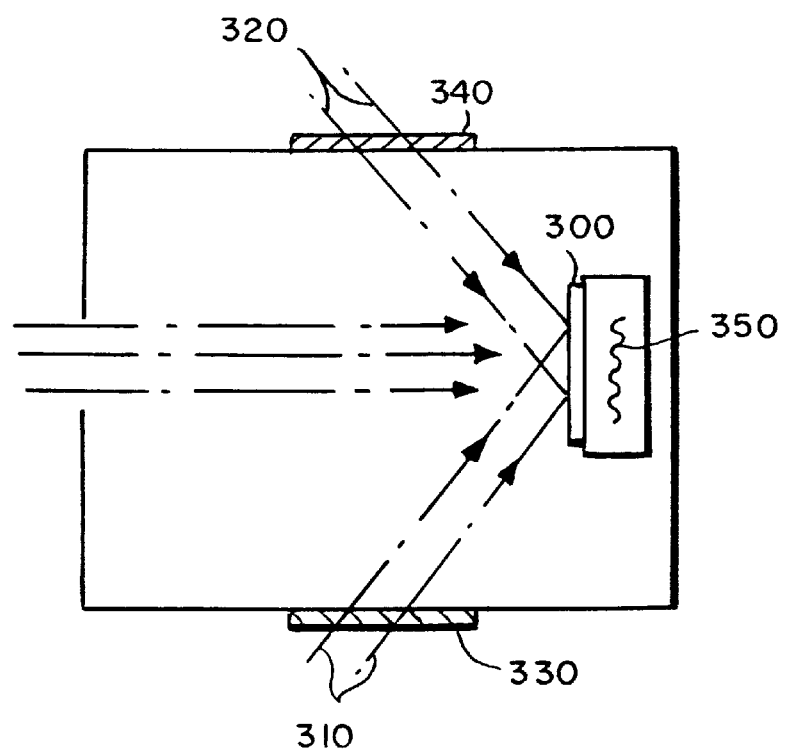

FIG. 33 depicts a laser-assisted chemical vapor deposition method according to the present invention.

Phonon Resonator

The present invention is directed to a phonon resonator. In particular, the invention provides a phonon resonator of an indirect bandgap material, which phonon resonator is designed so that certain electronic, optical, and/or heat transfer properties of the material are enhanced.

A phonon can be thought of as the minimum unit of vibrational energy allowed in accordance with principles of quantum mechanics. A phonon resonator is a structure that functions as a resonator for those vibrational excitations that behave as quantum mechanical vibrational wavepackets. By analogy with optical resonators, a vibrational resonator requires coherent confinement, or feedback, of vibrational energy.

It is possible to construct an electromagnetic resonator (that is, a structure that is resonant for electromagnetic waves) by producing a structure having a periodic variation in the material impedance. Similarly, a vibrational resonator can be produced by creating a structure having a periodic variation in material density, since material density determines the impedance of a vibrational wave.

One aspect of the present invention involves the recognition that a vibrational resonator can be constructed to be resonant with certain phonon-electron interactions, so that the resonator provides a resonant enhancement of the phonons necessary for those interactions. Although phonon resonators have previously been described previously (see, for example, Klein IEEE J. of Quant. Elec. QE-22: 1760–1779, 1986), the present invention describes for the first time a phonon resonator that provides resonant enhancement of phonon-electron interactions, with resulting improvement in optical, electronic, and/or heat transfer properties in the material from which the resonator is constructed. Additionally, the present invention provides the first example of a phonon resonator having a coupling length that is shorter than the phonon mean free path.

Below, we discuss the structural characteristics of the phonon resonator of the present invention, and the ways in which the phonon resonator affects the optical, electronic, and/or heat transfer properties of the material from which the resonator is constructed.

Enhancement of Optical Properties

The present invention encompasses indirect bandgap materials having enhanced optical properties. In order that certain aspects and advantages of the present invention will be more readily appreciated, we begin with a discussion of the properties of indirect bandgap semiconductor materials, as opposed to direct bandgap materials.

Figure 1:
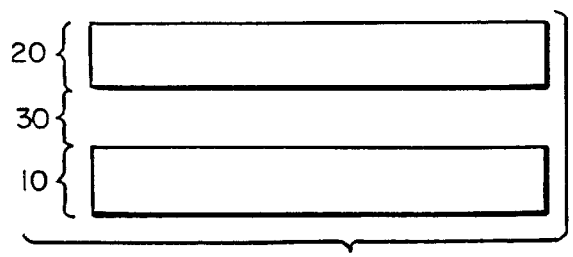
FIG. 1 is a schematic diagram of the energy bands in a solid.

First of all, we point out that, in any semiconductor solid (i.e. whether a direct or indirect bandgap material) that is free of defects and impurities, electrons can acquire only particular energy values that are within two discrete bands: a "valence band", which encompasses the range of energies possessed by electrons in bound energy states; and a "conduction band", which corresponds to the allowable energy states of free electrons or electrons that are unbound and move about the crystal lattice of the solid. FIG. 1 presents a schematic representation of a valence band 10 and a conduction band 20, separated by an "energy bandgap" 30 that corresponds to the range of impermissible energies between the valence 10 and conduction 20 bands.

For any given semiconductor solid, most of the energy states within the valence band are occupied by electrons, while most of the energy states within the conduction band are unoccupied. If, however, an electron in the valence band can acquire energy in excess of the energy of the bandgap, that valence band electron can occupy an energy state within the conduction band. When such a valence band electron is excited into the conduction band, that electron leaves behind a vacant energy state in the valence band. The vacant energy state is termed a "hole", and may be considered as a particle having a positive charge equal in magnitude to the electron.

Electrons in the conduction band typically occupy states near the conduction band minimum. Holes are generally present at the valence band maximum. Under certain circumstances, these electrons and holes can recombine, resulting in the emission of a photon, otherwise known as a "radiative transition." To obtain a radiative transition, both energy and momentum must be conserved.

Figure 2:
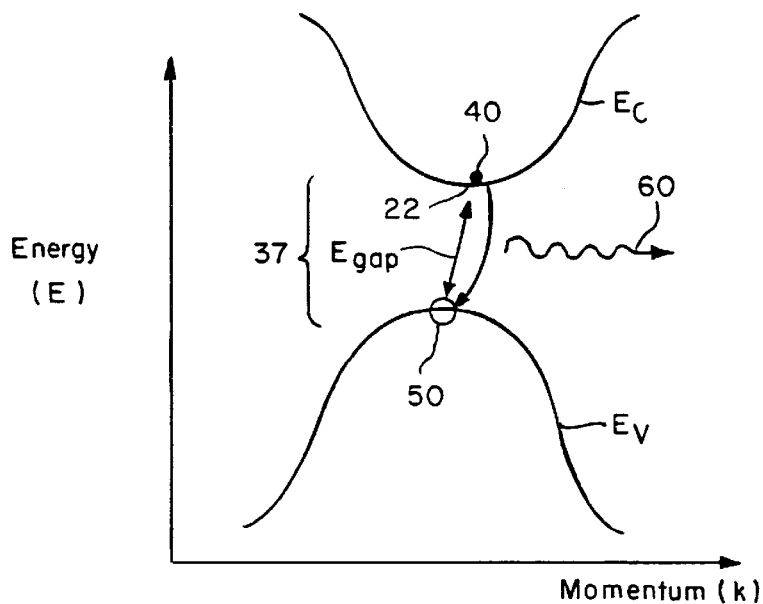
FIG. 2 is an energy vs. momentum diagram for a direct bandgap material.

Radiative transitions are allowed in direct bandgap materials. In fact, the term "direct bandgap" refers to the fact that the conduction band minimum and valence band maximum are aligned in these materials along the same momentum value. This fact is illustrated in FIG. 2, which presents a graph of the energy (E) versus momentum (k) relationship of an electron in a direct bandgap solid. The region 37 of the graph in FIG. 2 between curves $E_c$ and $E_v$ designates impermissible energy and momentum values for electrons in the solid. Curve $E_c$ (the conduction band edge) designates permissible energy and momentum values for electrons in the conduction band, and curve $E_v$ (the valence band edge) designates permissible energy and momentum values for electrons in the valence band. The energy difference between the conduction band minimum 22 of curve $E_c$ and valence band maximum 12 of curve $E_v$ is the energy bandgap 31.

The alignment of conduction band minimum and valence band maximum in direct bandgap materials allows radiative transitions because an electron 40 has the same momentum value both before (i.e. in the conduction band) and after (i.e. in the valence band) the transition (i.e. before and after recombination with hole 50). Thus, the conservation of momentum requirement for radiative transitions is satisfied. Similarly, the energy conservation requirement is satisfied because a photon 60 is emitted that has an energy equal to the energy lost by the electron as it recombines with the hole. The momentum of the photon 60 is so small compared to that of the electron 40 that, as mentioned above, the electron's momentum is effectively unchanged by the transmission.

By contrast, the valence band minimum and conduction band maximum are not aligned in indirect bandgap materials. In fact, the term "indirect bandgap" refers to the fact that these points are displaced relative to one another along a momentum axis. An energy band diagram for an indirect bandgap material is presented in FIG. 3. Reference numeral 15 identifies the valence band maximum in FIG. 3, and reference numeral 25 identifies the conduction band minimum.

Radiative transitions are effectively forbidden for indirect bandgap materials because, as noted above, photons are only emitted when an electron in the conduction band recombines with a hole in the valence band, and energy and momentum are conserved. Because the valence band maximum 15 and conduction band minimum 25 are displaced relative to one another in indirect bandgap materials, an electron located near the conduction band minimum 25 cannot recombine with a hole near the valence band maximum 15 without violating the conservation of momentum requirement (recall that the emitted photon has insignificant momentum).

Figure 3:
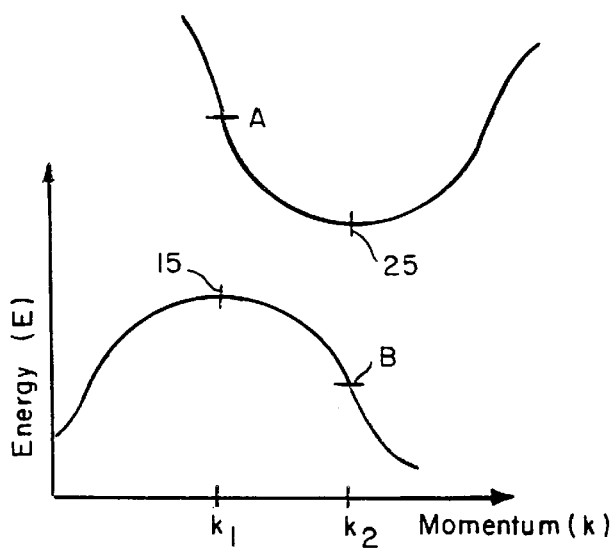
FIG. 3 is an energy vs. momentum diagram for an indirect bandgap material.

The conservation of momentum requirement would be satisfied for recombination events between either i) an electron having an energy and momentum corresponding to point A along the conduction band $E_c$ shown in FIG. 3 and a hole located near the valence band maximum 15, or ii) an electron occupying an energy state near the conduction band minimum 25 and a hole located at point B. However, it is very unlikely that an electron would exist at point A for any significant amount of time because any electron excited to that position would quickly undergo an intraband transition to the conduction band minimum 25. Similarly, a hole is unlikely to exist at position B because electrons occupy practically all of the states in the valence band about point B and vacant states or holes available for radiative transitions are principally located near the valence band maximum 15.

The lack of efficient recombination between electrons and holes in indirect bandgap materials has limited their usefulness in optical applications. Quite simply, optical devices require optical transitions, and optical transitions are inefficient in indirect bandgap materials. The problem is particularly acute for optical devices that employ optical amplifiers (e.g. lasers), which require "stimulated emission" of photons.

FIG. 4 illustrates the three possible photon-electron interactions that can occur in semiconductor materials: "absorption" (FIG. 4A), "spontaneous emission" (FIG. 4B), and "stimulated emission" (FIG. 4C). In stimulated photon emission, an incident photon 61, having an energy equal to the energy difference between a high energy state $E_2$ and a low energy state $E_1$, stimulates an electron 40 in the high energy state to return to the low energy state, releasing its energy in the form of a second photon 63 that is equal in energy and phase with the incident photon 61.

The effectiveness of an optical amplifier is related to its "optical gain", which is proportional to $e^{(gz)}$, where z is the distance along which an input signal propagates and g, the gain per unit length, is proportional to $R_{stim} - R_{abs}$. $R_{stim}$ is the rate at which photons are emitted by stimulated emission and $R_{abs}$ is the rate at which photons are absorbed. Thus, high optical gain requires that stimulated photon emission (FIG. 4C) exceed absorption (FIG. 4A).

In order for stimulated photon emission to exceed photon absorption, a specified number of electrons must be excited into a high energy state from a low energy state, a phenomenon known as "population inversion". For atomic or molecular transitions, a population inversion occurs when the following condition is satisfied:

$$N_2 > (B_{12}/B_{21})N_1,$$

where $N_2$ is the number of electrons in the high energy state $E_2$; $N_1$ is the number of electrons in the low energy state $E_1$; $B_{12}$ is a coefficient proportional to the rate at which photons are absorbed; and $B_{21}$ is a coefficient proportional to the rate at which photons are generated by stimulated emission.

There is a similar requirement for band-to-band transitions in semiconductors. If the population within each band has reached a quasi-equilibrium distribution, there is a characteristic fermi energy, termed "$\epsilon_{fV}$" for the valence band and "$\epsilon_{fC}$" for the conduction band. A population inversion is achieved for photon energies satisfying the relationship:

$$Eg < h\nu < \epsilon_{fC} - \epsilon_{fV}.$$

Thus, the "quasi-Fermi energy", or intraband chemical potential, gauges the population distribution in each band.

In a semiconductor laser, a population inversion can be created by generating electron-hole pairs (i.e. by exciting electrons into the conduction band and thereby creating holes in the valence band). For direct bandgap materials, such an increase in excited electron and hole density results in increased stimulated photon emission. For indirect bandgap materials, however, the inability of the excited electrons to readily recombine with holes limits the extent to which increased exciton population (i.e. increased electron-hole density) leads to increased stimulated emission. Moreover, as more electrons are excited into the conduction band, the so-called "free carrier absorption" also increases such that increased numbers of photons are absorbed by the electrons in the conduction band. Thus, even when a population inversion is present, stimulated emission typically does not exceed absorption in indirect bandgap materials.

As we have seen, both spontaneous and stimulated radiative transitions are effectively forbidden in indirect bandgap materials because an electron located near the conduction band minimum of an indirect bandgap material cannot recombine with a hole near the valence band maximum without violating the conservation of momentum requirement. This problem can be overcome if the momentum necessary to allow a radiative transition can be provided by crystal lattice vibrations, or phonons.

As shown in FIG. 5, atoms in a crystal lattice can be modelled, qualitatively, as balls 70 attached to one another by springs 75. Following the analogy, phonons correspond to the (quantized) vibrational motions of such balls propagating through the crystal as a wave. The interaction of a phonon with an electron in the conduction band can provide the necessary momentum to allow an "indirect", or "phonon-assisted", transition of the electron into a hole in the valence band, resulting in emission of a photon.

FIG. 6 illustrates three different mechanisms for phonon-assisted radiative transitions in an indirect bandgap material. The reference numbers in FIG. 6 are analogous to those in FIG. 4, so that 81 in FIG. 6 represents an incident phonon, and 83 represents an emitted phonon. FIG. 6A depicts a phonon-assisted radiative transition involving spontaneous emission of a phonon 83. FIG. 6B shows a mechanism involving stimulated phonon absorption; and FIG. 6C depicts a mechanism involving stimulated phonon emission. As noted above, both momentum and energy must be conserved in a radiative transition. In each type of phonon-assisted radiative transition depicted in FIG. 6, the phonon provides the requisite change in momentum, $(k_2-k_1)$, so momentum is conserved during recombination of an electron in the conduction band minimum with a hole in the valence band maximum. Consequently, a photon having an energy approximately equal to the bandgap is emitted. Specifically, the emitted photon has an energy, $E_p$, that is equal to the bandgap minus (for those mechanisms involving phonon emission) or plus (for mechanisms involving phonon absorption) the phonon energy, $\Theta$. That is:

$$E_p = E_q \pm \Theta.$$

Note that only phonons having the specified momentum $(k_2-k_1)$ can assist in the radiative transition.

Unfortunately, radiative, phonon-assisted transitions are rare in conventional semiconductor structures. Furthermore, electrons in indirect bandgap materials tend to recombine with defects or impurities (traps) in the crystal before recombining with a hole in the valence band. Such electron-trap recombination events are non-radiative and generate heat instead of photons. These problems have hampered researchers' abilities to incorporate indirect bandgap materials into optical devices.

How can phonon-electron interactions be enhanced in indirect bandgap materials? One way is to simply increase the number of available phonons. The idea behind the present invention is that a "phonon resonator" can be produced by making structure of periodically varying density, in which the vibrational energy (i.e. the phonon density) at the momentum necessary to produce an indirect optical transition is enhanced. Since, even at high frequencies, phonons are vibrational waves of masses (atoms) in a medium, changes in the mass density of the medium through which the phonons propagate can be used to increase the density of phonons of a desired momentum and energy, while diminishing those of other momenta and energies. Although the general concept of a phonon resonator is not new (see, for example, Klein IEEE J. of Quant. Elec. QE-22:1760–1779, 1986; it has not previously been appreciated that a phonon resonator could or should be designed to be resonant for phonons of appropriate wavevector to participate in phonon-electron interactions.

When a phonon resonator according to the invention is produced, radiative recombination events involving phonon absorption are enhanced in proportion to the ratio of the phonon density in the structure to the phonon density in a disordered (i.e. not having a periodically varying density) structure of the same material. A phonon resonator will achieve a high probability of indirect optical transitions if it is resonant for phonons of the appropriate momentum to participate in any of the recombination events depicted in FIG. 6 (i.e. in recombination events involving spontaneous emission of a phonon, stimulated phonon absorption, and/or stimulated phonon emission).

As is known in the art, the probability of spontaneous emission is locally modified in a resonator. Typically, some locations in a resonator have a very high probability of spontaneous emission, while other locations have comparatively low probabilities. Thus, by providing a phonon resonator, the present invention provides a material in which spontaneous phonon emission is enhanced. A resonator can also affect which energy and momenta are likely to attract spontaneously emitted phonons.

If there is a high rate of phonon generation in a resonator, both stimulated phonon absorption and stimulated phonon emission can be enhanced. In some instances, the resonator may be able to support a nonequilibrium phonon population that maintains itself through stimulated phonon emission. This is achieved when the phonon generation rate is equal to the scattering loss for the structure.

As mentioned above, the energy of the photon emitted in phonon-assisted radiative transitions has the value $E_p = E_q + \Theta$ when the photon is produced by a mechanism involving phonon absorption, and has the value $E_p = E_q - \Theta$ when the photon is produced by a mechanism involving phonon emission. Photons produced by a mechanism involving phonon absorption therefore have an energy greater than the bandgap energy. Such photons can readily be re-absorbed by the structure. On the other hand, photons produced by a mechanism involving phonon emission have an energy less than that of the bandgap and cannot readily be reabsorbed by the structure. Thus, optical gain is more readily achieved in a phonon resonator in which photon emission occurs through a process involving phonon emission rather than phonon absorption. For recombination events involving phonon emission, the enhancement of radiative transitions in a phonon resonator is equal to the number of phonons per vibrational mode of the resonator.

In accordance with a preferred embodiment of the present invention, a structure is created having alternating layers of relatively high mass density and relatively low mass density. The layered structure is resonant for phonons having a wavelength such that an integral number of half-wavelengths fits into the lattice period; phonons having other wavelengths propagate through the structure without any resonant reflection. One consequence of a strong resonance is an increase in the stored energy (i.e. phonon density) at the center of the structure. The period, $\Lambda_L$, of the layered structure of the present invention is chosen to provide a resonant Bragg reflection for phonons having the momentum necessary to participate in indirect transitions.

The layered structure of the present invention can be thought of as analogous to a distributed feedback laser. As shown in FIG. 7, a distributed feedback laser includes alternating layers of first 73 and second 77 materials having first and second indices of refraction. As light propagates through this layered medium (e.g. from left to right in FIG. 7), small reflections are generated at each interface ($i_1 \ldots i_n$ in FIG. 7). If each reflected wave is in phase, it reinforces the others so that the total net reflection is high and a resonance (e.g. a Bragg resonance) occurs. Also, the propagation of light through the material results in stimulated emission of additional photons that also propagate through the material and can be reflected at the layer interfaces. As discussed above, "lasing" occurs when stimulated emission exceeds absorption in the material. A distributed feedback laser will continue to lase as long as electrons are continually pumped into excited energy states.

The layered structure of the present invention operates in a similar fashion to the distributed feedback laser except that, instead of photons, it is phonons having the desired momentum that propagate through the material. The layered structure will only function as an effective resonator if the phonon mean free path is sufficiently long that the phonon scatters very little while passing through the structure. The mean free path of the phonon will be sufficiently long if the coupling coefficient, $\kappa_p$, between the incident and reflected phonons is greater than the inverse phonon scattering length, $\alpha_p$. That is, the following must be true:

$$\alpha_p << \kappa_p \approx (\pi/\lambda_p)(\Delta M/M),$$

where $\lambda_p$ is the phonon wavelength, $\Delta M$ is the modulation of the atomic mass, and $M$ is the average atomic mass. If this relationship does not hold, phonons scatter before Bragg reflection can occur.

The layered structure of the present invention may be realized in a crystalline solid, for example by alternating thin, isotopically-enriched layers—i.e. by making an "isotope superlattice." An "isotopically enriched" layer, as defined herein, is a layer having a concentration of an isotope which is greater than the concentration of the isotope found naturally. For example, in its naturally occurring form, silicon is primarily composed of three isotopes in the following compositions, 92.2% $Si^{28}$, 4.7% $Si^{29}$ and 3.1% $Si^{30}$. In accordance with the present invention, an isotopically-enriched layer of $Si^{28}$ is a layer that contains the isotope $Si^{28}$ in a concentration more than 92.2% of the atoms of that layer. Similarly, isotopically enriched layers of $Si^{29}$ and $Si^{30}$ are layers that have atomic concentrations of these isotopes that exceed 4.7% and 3.1%, respectively.

Isotope superlattices are known in the art (see, for example, Berezin Solid State Comm. 65:819–821, 1988; Berezin J. Phys. C. 20:L219–L221, 1987; Fuchs Sup. and Microstruct. 13: 447–458, 1993; Haller GADEST, '93). However, it has not previously been recognized that isotope superlattices can be engineered to be phonon resonators that are resonant for phonons of appropriate wavevector to participate in phonon-electron interactions. Generally speaking, in an isotope superlattice of the present invention, the larger the difference in mass density within the structure, the better the resonance. An isotope superlattice having alternating thin layers of $Si^{28}$ and $Si^{29}$ achieves a little over 3% modulation of mass density. Alternating $Si^{28}$ with $Si^{30}$ layers provides over 6% modulation.

As mentioned above, a layered structure of the present invention is resonant when an integral number, m, of half-wavelengths fits into the lattice period, that is, when $\Lambda_L = m(\lambda_p/2)$. Crystalline silicon exhibits an indirect bandgap, as shown in FIG. 8, in which the conduction band minimum is sixfold degenerate along the (100) direction, and occurs at approximately eight-tenths of the distance to the zone edge. Thus, the period, $\Lambda_L$, of the silicon isotope superlattice of the present invention is chosen for Bragg-resonant phonons of wavenumber $2\pi/\lambda_p = 0.8\,\pi/a$, where a is the lattice constant. For silicon, a is 4 atomic layers. The period of a silicon isotope superlattice of the present invention therefore follows the relationship:

$\Lambda_L = 5\,m$ atomic layers.

Thus, for example, superlattices of the form $Si^{28}{}_n Si^{30}{}_{5m-n}$, for $n \neq 0$, will provide a resonance for phonons capable of participating in an indirect transition. For m=1, the case that provides the lowest order Bragg reflection, this yields a period of about 1.25 lattice constants, or, in the case of silicon, 5 atomic layers. Any silicon isotope superlattice having a period that is an integer multiple of 5 atomic layers will satisfy the Bragg resonance condition, using higher order scattering. FIG. 9 shows a schematic representation of a portion of a silicon isotope superlattice of the present invention.

The increased phonon density associated with an isotope superlattice of the present invention may serve to increase the exciton stability. In material that is not enriched, there is a fixed relation between the number of free electrons and the number of electrons bound to holes in an exciton ("exciton population"). Free electrons have a lifetime (the time required for an electron to recombine nonradiatively with a trap) on the order of one microsecond or less, while excitonic electrons have radiative lifetimes much longer than one microsecond. When the radiative transition rate is increased in accordance with the present invention, the exciton radiative lifetime is reduced. Accordingly, fewer conduction electrons exist as free electrons, and more electrons are available for exciton formation.

When the exciton radiative lifetime is decreased, room temperature excitonic interactions can occur in indirect bandgap materials, such as silicon. The free exciton binding energy in materials such as silicon is 14.7 meV, much larger than that observed in direct-gap materials such as GaAs. Despite this fact, excitons do not exist in silicon at room temperature. The primary reason for this is that, in silicon, the rate of radiative transitions is much lower than the rate of nonradiative band-to-band recombination processes. Thus, an increase in radiative transitions, as provided by a phonon resonator of the present invention, will result in stable excitons at much higher temperatures. These stable excitonic interactions can provide the basis for light emission, absorption, modulation, and nonlinear optical properties in such indirect bandgap materials. For example, the photon absorption of an exciton can change in the presence of an electric field (Stark effect). Therefore, in accordance with the present invention, an optical modulator based on the Stark effect can be made of indirect bandgap materials.

The following Examples describe various optical devices that incorporate a phonon resonator of the present invention.

EXAMPLE 1

Light-emitting device

A phonon resonator of the present invention may be incorporated into a light-emitting device, as depicted in FIG. 10. In FIG. 10, the phonon resonator 100 is positioned between electrodes 110 and 120. Electrodes 110 and 120 may comprise semiconductor materials or conductor materials. These electrodes 110 and 120 serve to facilitate formation of a population inversion in the phonon resonator 100 by injection and/or confinement of carriers (i.e. electrons or holes) in this region.

Figure 11A:
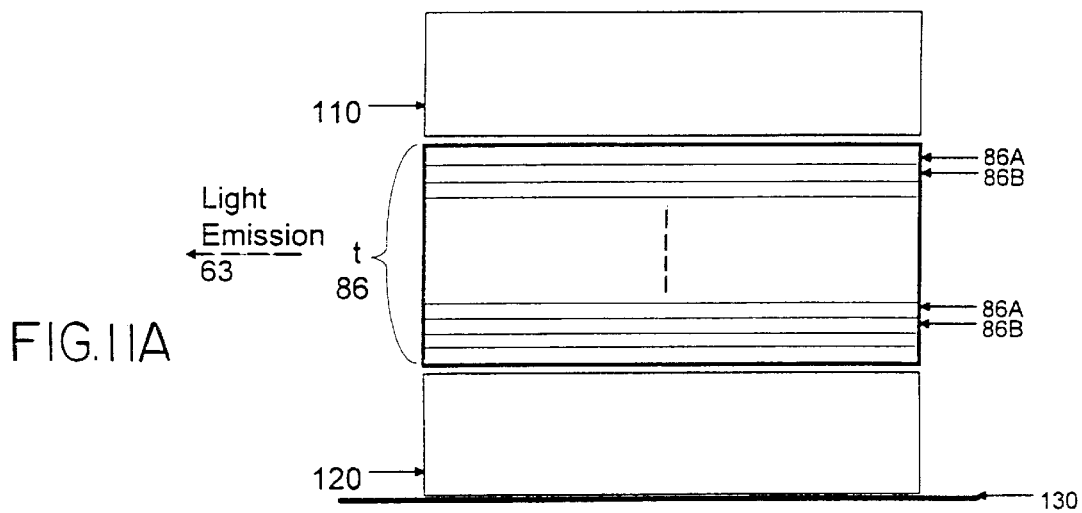

In preferred embodiments of the light-emitting device of the present invention, the phonon resonator 100 is an isotope superlattice. For example, FIG. 11 presents four embodiments of a light-emitting device of the present invention in which an isotope superlattice 86 is positioned between electrodes 110 and 120. In FIG. 11A, the device structure includes an electrode layer 120 formed on a substrate 130. The isotope superlattice 86 consists of alternating isotopically-enriched layers 86A and 86B and is disposed on electrode 120. Second electrode 110 is formed on isotope superlattice 86.

Figure 11B:
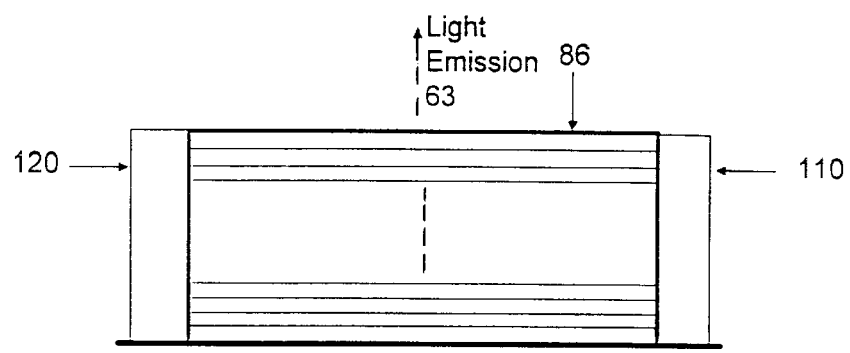
Figure 11C:
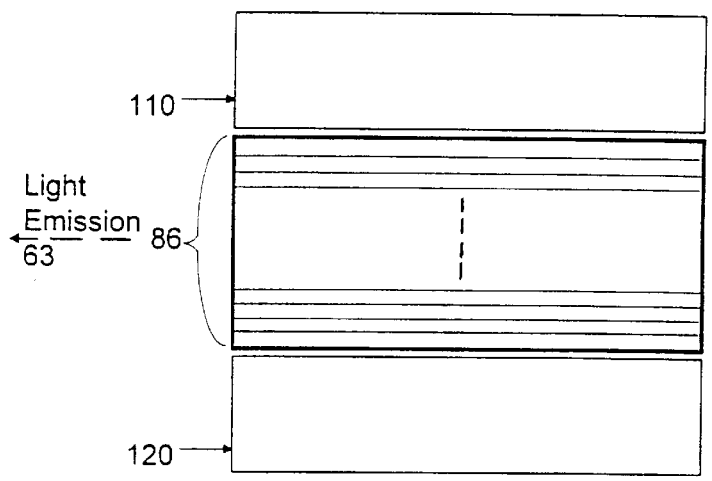
Figure 11D:
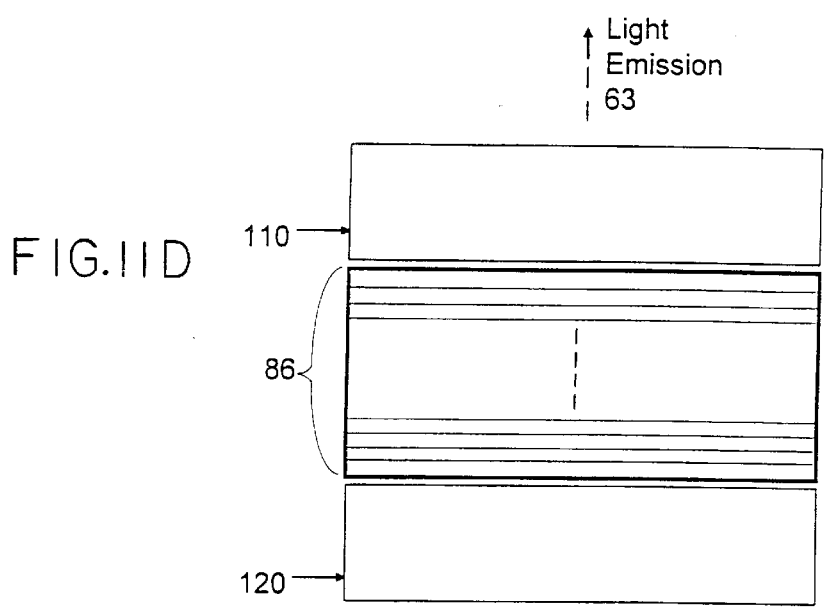

As seen in FIG. 11B, electrodes 110 and 120 may be disposed laterally on opposite sides of isotope superlattice 86. Also, as would be apparent to one of ordinary skill in the art, a light-emitting device of the present invention may be constructed to be an edge-emitter (see FIG. 11C), or a surface emitter (see FIG. 11D). As shown in FIG. 11D, the device will be a surface emitter if one electrode 110 is transparent.

Where the phonon resonator utilized in the light-emitting device of FIG. 10 or FIG. 11 is a silicon isotope superlattice, the thickness, t, of the isotope superlattice 86 should be adequate to allow vibrational wave coupling. Preferably, $t \gg 1/\kappa_p$, where $\kappa_p$ is the coupling coefficient (see above). As given above, $\kappa_p \approx (\pi/\lambda_p)(\Delta M/M)$, where $\lambda_p$ is the phonon wavelength, $\Delta M$ is the modulation of the atomic mass, and M is the average atomic mass. As mentioned above, $$\Lambda_L = m(\lambda_p/2).$$

Thus, $$t \gg (2\Lambda_L/m\ \pi)(M/\Delta M).$$

The number, N, of superlattice periods is equal to the thickness divided by the lattice period, i.e. $N = t/\Lambda_L$. The following relationship therefore holds for preferred silicon isotope superlattices of the present invention:

$$N \gg (2/\pi)(M/\Delta M)(1/m)$$

For an isotope superlattice of $Si^{28}$ and $Si^{30}$, $(\Delta M/M) = 0.06$. Thus, for first order coupling (m=1), the number of $Si^{28}/Si^{30}$ superlattice periods should preferably be greater than approximately 10, which corresponds to greater than approximately 50 atomic layers. Such an $Si^{28}/Si^{30}$ superlattice is greater than approximately 100 Å thick.

Such light-emitting devices incorporating a phonon resonator of the present invention include light-emitting diodes and diode lasers (both Fabry-Perot and distributed feedback; see below). Light emitting devices of the present invention can be utilized alone, incorporated into other devices, or, for example assembled into an array used as a display. The present invention therefore encompasses a wide array of light emitting devices and/or systems, including any device or system in which at least one component incorporates a phonon resonator of the present invention.

EXAMPLE 2

Light-emitting diode

A light-emitting diode (LED) incorporating a phonon resonator of the present invention can be produced by equipping a generic light-emitting device such as that described in Example 1 above with a p-n junction, as is known in the art, for efficient injection of electrons and holes. FIG. 12 depicts a simple embodiment of such an LED.

As seen in FIG. 12, an LED according to a preferred embodiment of the present invention constitutes a diode having an isotope superlattice 86 at the p-n junction. An n-type electrode layer 84 of single crystal silicon is grown on a substrate. An isotope superlattice 86 is then preferably grown on n-type layer 84. The isotope superlattice may contain, for example, ten alternating isotopically enriched layers, for example of $Si^{28}$ and $Si^{30}$. A p-type electrode layer 82 comprising single crystal silicon is then formed on isotope superlattice 86. As is known in the art, doping can, in principle, be accomplished either by ion implantation or by epitaxial growth. Also, the n-type 84 and p-type 82 layers may be doped regions of the isotope superlattice 86, or may alternately be constructed from different materials (e.g. bulk silicon). Where the layers are doped regions, doping may be accomplished by any method available in the art, including, for example, diffusion, incorporation during growth, ion implantation, or neutron transmutation doping (see, for example, Hailer Semicond. Sci. Tech. 5:319, 1990, incorporated herein by reference).

Preferably, the isotope superlattice is as thick as the depletion layer that would otherwise be formed between the p-type layer 82 and n-type layer 84. Electrons and holes can be injected into isotope superlattice layer 86 by applying a positive voltage to p-type layer 82 relative to the voltage applied to n-type region 84, thereby forward biasing the semiconductor laser diode. Photons 63 may then be emitted from the LED as shown in FIG. 12, which depicts a surface-emitting device.

The main technical requirement for overall efficiency in an LED such as that depicted in FIG. 12 is a high radiative quantum efficiency (the average number of photons emitted per electron-hole pair injected). In preferred embodiments of the LED of the present invention, high radiative quantum efficiency is achieved by providing a structure in which electrons and holes are confmed in the same region. As is known in the art, this can be achieved by a heterojunction.

FIG. 13 presents a depiction of an LED of the present invention utilizing a heterojunction. As depicted in FIG. 13, p and n layers 82 and 84 are substituted with p and n layers 92 and 94, respectively, that have a larger bandgap than that of the material in the isotope superlattice 86. For example, layers of SiGeC alloy can be utilized with a silicon isotope superlattice. Electrons and holes are confined within the isotope superlattice.

FIG. 14 provides another embodiment of an LED of the present invention. Specifically, FIG. 14 presents an edge-emitting LED that includes a dielectric waveguide 95 to provide optical as well as carrier confinement. As depicted in FIG. 14, a substrate 114 and a cover 112, each having refractive indexes, $n_s$ and $n_c$ respectively that are less than the refractive index, $n_p$, of the phonon resonator 100, are positioned on opposite sides of the phonon resonator 100. In preferred embodiments, the phonon resonator 100 comprises an isotope superlattice, preferably of silicon. As would be apparent to one of ordinary skill in the art, it is often possible to select materials for the cover 112 and substrate 114 that have both a lower refractive index and a higher band gap than does the phonon resonator 100, so that the resultant LED has both a waveguide and a heterojunction.

EXAMPLE 3

Laser diode

A phonon resonator of the present invention may be employed in a laser diode. In addition to requiring carrier and optical confinement (see above), a laser requires feedback. Feedback is accomplished by reflection, distributed feedback, or a combination of the two.

FIG. 15A depicts a cleaved facet reflection laser, also known as a Fabry-Perot laser, of the present invention. The cleaved facet reflection laser depicted in FIG. 15A constitutes a diode having a phonon resonator 100, such as an isotope superlattice, at the p-n junction (see above for description). The laser further includes two facet reflectors 210, 220 disposed on opposing ends of the phonon resonator 100 that functions as a waveguide 95. Of course, as would be apparent to one of ordinary skill in the art, a dielectric waveguide is not an essential component of a laser of the present invention. In some circumstances, a device can be constructed with a region of very high gain that acts to provide a self-guiding optical wave.

FIG. 15B presents a distributed feedback laser of the present invention. As depicted in FIG. 15B, the phonon resonator 100 functions as both a phonon resonator and a waveguide with substantially periodic optical characteristics (e.g. absorption or refractive index) such that the periodically varying waveguide supplies a Bragg resonance between forward and backward travelling waves. Such periodically-varying optical properties are achieved by the corrugation 97 of one or more waveguide layers. Alternatively, the periodically-varying optical properties may be achieved by providing a phonon resonator 100 comprising a multitude of adjacent phonon resonators, 100A, 100B, etc. (see FIG. 15C) spaced so that a Bragg resonance between forward and backward travelling waves is provided.

EXAMPLE 4

Vertical cavity surface emitting laser

A phonon resonator of the present invention may also be incorporated into a vertical cavity surface emitting laser (VECSEL). As depicted in FIG. 16, a VECSEL of the present invention comprises a top reflector 122 and a bottom reflector 124 positioned around a phonon resonator 100 as a p-n junction (see above). Electrodes 110 and 120 are positioned across the p-n junction and serve to inject current into the phonon resonator 100, thereby creating optical gain.

The bottom reflector reflects approximately 100% of incident radiation and comprises alternating layers of materials having different refractive indices, $n_1$ and $n_2$. Each layer has a thickness equal to $\lambda/2$, where $\lambda$ is the wavelength of the amplified radiation. The thickness, $t_{124}$, of the bottom reflector 124 follows the relationship:

$$\text{Tanh}^2\left(\frac{\pi|n_2 - n_1|t_{124}}{\lambda}\right) \approx 1,$$

so that the bottom reflector 124 has approximately 100% reflectivity.

The top reflector 122 is also constructed of alternating layers, having thickness, $t_{122}$ $\lambda/2$, of materials having refractive indices n, and $n_2$, and the thickness of the top layer is selected so that between approximately 90% and 100% of incident radiation is reflected. That is:

$$\text{Tanh}^2\left(\frac{\pi|n_2 - n_1|t_{122}}{\lambda}\right) \approx 0.9.$$

Thus, the top reflector 122 allows between approximately 0% and 10% of incident radiation to be emitted as photons 63.

EXAMPLE 5

Optical amplifier

A phonon resonator of the present invention can be fashioned into an optical amplifier, for example, by incorporating the phonon resonator into a p-n junction and optical waveguide as described above (see Example 2). The p-n junction is then pumped with an injection current in such a way that the phonon resonator exhibits optical gain through stimulated emission of photons. An optical signal having a photon energy approximately equal to the band-to-band transition energy of the phonon resonator is then injected into the waveguide. The optical signal experiences amplification when it passes through the portion of the waveguide that incorporates the phonon resonator.

EXAMPLE 6

Optical communication system

As will be apparent to one of ordinary skill in the art, optical and/or optoelectronic devices incorporating a phonon resonator of the present invention can be combined with one another and/or with other devices as components of an optical communication system. For example, one embodiment of an optical communications system of the present invention utilizes a light source (i.e. light emitting device) and/or an optical detector that incorporates a phonon resonator of the present invention. The light source is modified so that information is encoded in the intensity, phase, or frequency of the light. The detector, in turn, is designed to convert the information into electrical impulses suitable for further signal processing. In other embodiments of the present optical communication system, a phonon resonator of the present invention is incorporated into a laser, an optical amplifier, a modulator, a switch, a deflector, and/or a scanner.

As is well known in the art, optical communications can be useful for long distance communications, local area networks, optical data storage, and/or broadcast services such as cable television. Such systems are also useful for interconnections among and within circuit boards and integrated circuits.

EXAMPLE 7

Self-sustained oscillator for phonons and photons

A phonon resonator of the present invention can be constructed so that it satisfies known requirements for photon resonators (e.g. so that optical gain is greater than cavity loss; see, for example, Agrawal et al. *Long Wavelength Semiconductor Lasers* Van Nostrand Reinhold New York 1986; Bass (ed) *Handbook of Optics*, Volumes I and II, McGraw-Hill, New York, 1995, each of which is hereby incorporated by reference), and is therefore resonant for both phonons and photons. In such a structure, the phonon and photon populations are coupled and the structure functions as a self-sustained, coupled phonon/photon oscillator. As is known in the art, generic coupled oscillators that show nonlinearity exhibit hysterisis, bistability, and switching (see, for example, Tsang et al. IEEE J. Quant. Elec. 19:1621, 1983; Chapter 15 of *Optical Nonlinearities in Semiconductors* by Haug, Academic Press, San Diego (1988), and references cited therein). Thus, following art-known principles, in combination with the teachings of the present invention, a self-sustained, coupled phonon/photon oscillator can be produced in which the phonon and photon populations are coupled in such a way that the nonlinear dynamics lead to hysterisis, bistability, and switching in the vibrational and/or optical output. In preferred embodiments of the self sustained, coupled phonon/photon oscillator of the present invention, a laser is constructed as set forth in either Example 3 or Example 4, and the nonlinearity is supplied by the population in the laser.

EXAMPLE 8

Optical detector/modulator

A phonon resonator of the present invention can also be incorporated into an optical photodetector or optical modulator. FIGS. 17 and 18 depict two different embodiments of a photodetector/modulator of the present invention.

With reference to FIG. 17, a lightly doped phonon resonator 100 is constructed in a p-n junction. A transparent electrode 110 and an electrode 120 are positioned on opposite sides of the heterojunction so that incoming radiation passes through the transparent electrode 110, and through the p-type region 82, and is absorbed in the phonon resonator 100 so that an electron-hole pair is produced and a photocurrent is induced between electrodes 110 and 120.

With reference to FIG. 18, electrodes 111 and 121 form an interdigitated pattern on the surface of the phonon resonator, and the photodetector/modulator has a substantially horizontal geometry as compared with the embodiment depicted in FIG. 17. The electrodes may either form ohmic contacts to neighboring p doped and n doped regions, or may form Schottky contacts to a uniformly doped phonon resonators. One advantage of this design is that it permits high speed switching or detection due to the close proximity of the electrodes, and therefore to the short transit time required to communicate between them.

Enhancement of Electrical Properties

The present invention also relates to indirect bandgap materials having enhanced electrical properties. Specifically, the invention encompasses materials having enhanced conductivity, including superconductivity, due to the presence of bound electron pairs. In order that certain aspects and advantages of the present invention will be more readily appreciated, we begin with a discussion of the properties of conduction band electrons, and electron-phonon interactions, in semiconductor materials.

As illustrated in FIG. 19, a conduction band electron can absorb or emit a phonon. The interaction between an electron and a phonon "scatters" the electron from one energy/momentum state to another. Specifically, absorption of a phonon increases the energy of the electron by an amount, $E_p$, equal to the energy of the phonon, and changes the momentum of the electron by an amount equal to the wavenumber of the phonon. Likewise, phonon emission decreases the energy of the electron, and also changes the electron momentum.

"Coherent absorption and emission" of a phonon by a single electron can also occur (see FIG. 20), and results in a small net decrease in the energy of the electron relative to what its energy would have been were if truly free in a frozen lattice. With reference to FIG. 20, the exclusion principle requires that an electron in state A can only undergo coherent absorption and emission of a phonon if state B is unoccupied. Thus, the presence or absence of an electron in state B can affect the energy of an electron in state A, independent of any electrostatic (e.g. Coulombic) interaction between two electrons in those states.

If two or more electrons are present, phonon-electron interactions can result in electron-electron interactions that can, in turn, lead to formation of "bound pairs" of electrons. As shown in FIG. 21, if both state A and state B are occupied by electrons, and phonons of wavenumber q are available, electron-phonon interactions can result in the electrons "exchanging" states. The exclusion principle dictates that the two events involved in the exchange (i.e. the transfer of the electron originally at position A to position B, and the transfer of the electron originally at position B to position A) are not independent; hence, there is an effective electron-electron interaction. If the effective pair potential, $V(r_1-r_2)$, of the interacting electrons is negative, a "bound pair" of electrons may be produced.

Assuming that the scattering rate is proportional to the matrix element of the perturbation V between the two electron states $|k_1, -k_1>$(state "A") and $|k_2, -k_2>$(state "B"), the effective pair potential between electrons in state A and state B can be calculated as follows:

$$V(r_1-r_2)=\int\int dk_1 dk_2 <k_1,-k_1|V|k_2,-k_2>\exp(-i(k_1-k_2)\cdot(r_1-r_2))$$

In fact, exchange between a conduction band electron in state A and electron in state B, as depicted in FIG. 21, is unlikely to occur, simply because, as mentioned above, electrons in the conduction band typically occupy states near the conduction band minimum. Thus, state B is unlikely to be occupied. However, as discussed above, some semiconductor materials (e.g. silicon) have a degenerate conduction band minimum. Each of the different minima of the degenerate conduction band is equally likely to be occupied. Thus, when an appropriate electron scattering mechanism is available, electronic exchanges can occur between electrons in different, degenerate, conduction band minima. In preferred embodiments of the present invention, electron scattering is provided by interaction between an electron and a phonon of appropriate wavenumber. FIG. 22 depicts an example of such an exchange event, termed "intervalley scattering", occurring between opposite, degenerate conduction band minima.

In the case presented in FIG. 22, an electron is scattered from a state A (wavenumber k) to a state B (wavenumber –k), upon interaction with a phonon of wavenumber $2\pi/\Lambda_L$, where $\Lambda_L$ is the period of the semiconductor material lattice. Thus, the matrix element can be expressed as:

$$<k_1,-k_1|V|k_2,-k_2>=g(k_1)\delta(k_1+k_2),$$

and the corresponding pair potential is given by:

$$V(r_1-r_2)=\int g(k_1)\exp(-2ik_1\cdot(r_1-r_2))dk_1$$

If the lattice structure is infinite, g(k) will contain only narrow components near $\pm(\pi/\lambda)e_z$, and the pair potential will have the form:

$$V(z_1-z_2)=V_0\cos[2\pi(z_1-z_2)/\Lambda_L],$$

where z denotes the direction of the lattice, $e_z$ is a unit vector in the z direction, and $V_0$ is a measure of the scattering strength. We can crudely include the effects of small wavevector scattering of each electron by postulating a "screening" of the pair potential, which is a function of the electron mean-free-path. The pair potential then has the form:

$$V(z_1-z_2)=V_0\exp(-\alpha|z_1-z_2|)\cos[2\pi(z_1-z_2)/\Lambda_L]$$

in which $\alpha$ denotes the inverse, single-electron mean free path. This potential is illustrated in FIG. 23, in units of $V_o$ (the maximum possible scattering strength). The pair potential is oscillatory, and damps with the electronic mean free path. An electron pair having a wavefunction with maxima that overlap the potential minima will see a minimum in energy. If $V_o$ is comparable in magnitude to the Coulomb repulsion, and the mean free path extends over many superlattice periods, bound electron pairs may exist. The electron mean free path, which tends to decrease with temperature, therefore represents an important limiting factor in electron bound-pair formation.

The strength of the Coulomb interaction between electrons having large wavevector mismatch is proportional to $1/q^2$, where q is the magnitude of the mismatch. The Coulomb interaction between electrons in opposite valleys of a degenerate conduction band will therefore be somewhat weaker than that observed between electrons in the same conduction band valley. Thus, the probability of intervalley bound-pair formation is much higher than is the probability of formation of bound electron pairs within a single conduction valley.

Intervalley bound pairs will only form if the pair binding energy is greater than zero. We can carry out a variational calculation of the ground state of the pair, and show that a bound state between electrons can exist even in the presence of carrier-carrier scattering.

Specifically, we postulate a one-dimensional wavefunction (in z) which is separable into center-of-mass $(z_1+z_2)/2$ and difference $(z_1-z_2)$ coordinates. We then examine the Schrodinger equation for the pair wavefunction $$-\frac{\hbar^2}{2m^*_{ee}}\frac{d^2}{d\xi^2}\psi(\xi) + \left(V(\xi) + \frac{e^2}{4\pi\epsilon_0\xi}\right)\psi(\xi) = E\psi(\xi)$$

in which $m^*_{ee}$ denotes the reduced mass of the pair, and $\xi$ denotes the pair separation; $V(\xi)$ denotes the pair potential shown in FIG. 2 (equation 10) and the second potential energy term is the Coulomb repulsion. We introduce the following changes of variables, normalizing all length scales to q, which denotes half of the wavevector separation between conduction band minima:

$$\tilde{\alpha} = \frac{\alpha}{q}$$

$$z' = q\xi$$

$$q = \frac{\pi}{\Lambda}$$

$$E_0 = \frac{\hbar^2 q^2}{2m^*_{ee}}$$

$$V_c = \frac{e^2 q}{4\pi\epsilon}$$

The following wavefunction then serves as a trial wavefunction:

$$\psi(z') = (2\beta(1+\beta))^{1/2}\exp(-\beta z')\sin(z'),$$

in which β is chosen that the expectation value of the energy is minimized. Completing this calculation, we find the result that β is a solution to the equation:

$$V_0 = 2\frac{(2\beta+\alpha)^2}{\alpha}\left[E_0\beta - V_c(\ln(\beta)+1)\right]$$

In the absence of Coulomb repulsion, if we allow α to approach zero (the limit of very low carrier-carrier scattering), the ground state energy approaches the limit:

$$\langle E \rangle = E_0 - V_0/2,$$

The first term is the energy of the non-interacting pair, while the second term gives the binding energy. Thus, $V_o/2$ represents the binding energy in the low temperature limit.

FIG. 24 shows the reduction in the binding energy with increasing α (decreasing electronic mean free path), while FIG. 25 shows the binding energy as a function of the scattering potential $V_0$ for a fixed mean free path of 100 nm. From these calculations and Figures, we see that, when the mean free path is much longer than the superlattice period, the electron pair binding energy is given by $V_0/2$.

As mentioned above, electrons can be scattered by interaction with phonons. We have discussed two different types of phonon-electron scattering: (i) scattering within a single conduction band valley; and (ii) intervalley scattering between different degenerate conduction band minima in the same conduction band. For some semiconductor materials, there is an additional available type of phonon-electron scattering. Some semiconductor materials, such as silicon (see FIG. 8), have an interleaved fcc structure that results in duplicate, neighboring Brillouin zones. In such materials, "interzone" intervalley scattering can occur between conduction band minima of neighboring Brillouin zones, as is depicted in FIG. 26, and can lead to the formation of interzone intervalley bound electron pairs.

It is well known that establishment of bound electron pairs within a material increases the conductivity of that material, because bound electron pairs behave as bosons rather than fermions, and are therefore not subject to an exclusion principle. The present invention provides a material with enhanced electrical conductivity by providing a material with bound electron pairs, preferably by increasing the rate of intervalley scattering (either direct or interzone) in the material.

The level of intervalley scattering in a given material, of course, depends on the availability of phonons having the appropriate momentum. The present invention therefore provides a phonon resonator in which the vibrational energy (i.e. the phonon density) at the momentum necessary to produce direct and/or interzone intervalley scattering is enhanced. As discussed above, such a phonon resonator is produced by providing a structure of periodically varying density, where the period of the structure is selected to increase the density of phonons having a momentum value and a wavelength appropriate to produce intervalley scattering.

As shown in FIG. 8 and discussed above, crystalline silicon exhibits an indirect bandgap in which the conduction band minimum is six-fold degenerate along the (100) direction, and occurs at approximately eight-tenths of the distance to the edge of the Brillouin zone. The degenerate conduction band minima of a single conduction band are therefore separated by 1.6 π/a in silicon. Thus, for a silicon isotope superlattice to be resonant for phonons that can participate in intervalley scattering between the degenerate conduction band minima of a single conduction band, the superlattice would have to have a period of:

$\Lambda_L$=2.5 m atomic layers.

For m=1, the case that provides the lowest-order Bragg reflection, this yields a period of about 0.625 lattice constants, or 2.5 atomic layers. Practically, it is unlikely that such a structure can be produced, simply because the superlattice period is too small.

On the other hand, FIG. 8 shows that the conduction band minima of neighboring Brillouin zones are separated by only 0.4 π/a in silicon. Thus, an electron could scatter from one conduction band minimum to the closest neighboring conduction band minimum by interaction with a phonon of momentum q=0.4 π/a. For a silicon isotope superlattice to be resonant for phonons that can participate in such interzone intervalley scattering, therefore, the superlattice would have to have a period of:

$\Lambda_L$=10 m atomic layers.

For m=1, the case that provides the lowest-order Bragg reflection, this yields a period of about 2.5 lattice constants, or 10 atomic layers of silicon.

Thus, the lowest-order silicon isotope superlattice of the present invention that acts as a resonator for phonons capable of participating in interzone intervalley scattering has a period double that of the lowest-order silicon isotope superlattice of the invention that is a resonator for phonons capable of participating in indirect radiative transitions. Because lattices having periods that are integer multiples of the period of the lowest-order resonator are also resonant for the same phonons for which the lowest-order resonator is resonant, it is clear that it is possible to produce an isotope superlattice of the present invention that is resonant both for phonons capable of participating in interzone intervalley scattering and for phonons capable of participating in indirect radiative transitions.

EXAMPLE 9

Low-resistance conductor

A phonon resonator of the present invention can be incorporated into a low-resistance conductor. One embodiment of such a low-resistance conductor, is depicted in FIG. 27. As depicted in FIG. 27, two devices 230*a, b* are connected by means of a phonon resonator 100, that carries electrical signals between the devices 230*a, b*. As would be readily apparent to one of ordinary skill in the art, it may be desirable to dope the low-resistance conductor of the present invention, or other devices discussed herein. In such cases, doping may be accomplished by any method available in the art, including, for example, diffusion, incorporation during growth, ion implantation, or neutron transmutation doping (see, for example, Haller Semicond. Sci. Tech. 5:319, 1990, incorporated herein by reference).

EXAMPLE 10

Planar transformer

As is known in the art, a planar transformer is formed when at least two conducting pathways are arranged with respect to one another, e.g. in a serpentine configuration, so that alternating current flow is provided. A phonon resonator of the present invention can be incorporated into one or more of the conducting pathways, to produce a planar transformer with enhanced electrical conductivity, and therefore enhanced magnetic properties. Of course, a phonon resonator of the present invention could also be incorporated into other devices whose magnetic properties stem from electrical conductivity.

EXAMPLE 11

Diode

A phonon resonator of the present invention can be incorporated into a diode as depicted in FIG. 28. The phonon resonator 100 is incorporated into a p-n junction to form a diode with enhanced electrical properties. Contacts 240*a*, and *b* are shown positioned on opposite sides of the junction.

EXAMPLE 12

Bipolar Transistor

FIG. 29 depicts a npn bipolar transistor incorporating a phonon resonator of the present invention. The base 250 of the transistor comprises a phonon resonator 100 that enhances conduction between the emitter 260 and the collector 270.

EXAMPLE 13

Field Effect Transistor

FIG. 30 depicts a n-type Junction Field Effect Transistor (JFET) incorporating a phonon resonator of the present invention. The gate 310 comprises a phonon resonator 100 that enhances conduction between source 320 and drain 330. As would be apparent to one of ordinary skill in the art, a phonon resonator could also be incorporated into an n-channel Metal Oxide Semiconductor Field Effect Transistor (MOSFET) (see FIG. 31).

EXAMPLE 14

Integrated circuit

FIG. 32 depicts an integrated circuit utilizing a combination of the above-described components (eg. a low-resistance conductor, a diode, a bipolar transistor, a JFET, and/or a MOSFET) incorporating a phonon resonator. Any useful combination of components may be utilized, and related components that do not incorporate a phonon resonator may be used in combination with components that do utilize a phonon resonator for enhanced electrical conduction.

Accelerated Heat Transfer from a Phonon Resonator

Electron-phonon interactions can be thought of as a source by which nonequilibrium phonons are generated. Thus, electron-phonon interactions can provide the gain mechanism necessary to achieve the vibrational analog of laser action in a resonator. Once such a phonon resonator reaches threshold, the emitted energy becomes both coherent and highly directional. A phonon resonator operating above threshold can therefore provide accelerated heat transfer from the resonator to the substrate on which the resonator resides via the coherent, directional emission of vibrational energy to the substrate.

Further, just as a variety of systems exhibit stochastic resonances in the presence of nonlinearities, vibrational anharmonicities combined with a phonon resonator would be expected to exhibit stochastic resonances. These resonances are both coherent and directional, providing accelerated heat transfer from (or through) an isotope superlattice.

Method of Producing a Phonon Resonator

A phonon resonator of the present invention can be fabricated by any of a variety of methods. We describe here the preparation of an isotope superlattice phonon resonator. There are two aspects to any method of producing an isotope superlattice: i) providing separate, substantially pure isotopes; and ii) assembling the substantially pure isotopes in a layered structure of the invention. These two aspects can be performed separately or simultaneously.

Available methods for isotope separation include, among others, gaseous diffusion, gas centrifuge, fractional distillation, aerodynamic separation, chemical exchange, electromagnetic separation, and laser dissociation/ionization (see, for, example London Separation of Isotopes, London: George Newnes, Ltd., 1961; Spindel et al. J. Chem. Engin. 58, 1991; Olander Sci. Am. 239:37, 1978; Stevenson et al. J. AM Chem. Soc. 108: 5760, 1986; Stevenson et al. Nature 323:522, 1986; Bigelelsen Science 147: 463, 1965; Tanaka et al. Nature 341: 727, 1989; Ambartzumion Applied Optics, 11, p. 354, 1972; N. R. Isenor et al. Can. J. Phys. 51:1281, 1973; Epling et al. Am. Chem. Soc. 103:1238, 1981; Kamioka et al. J. Phys. Chem. 90:5727, 1986; Lyman et al. J. App. Phys. 47:595, 1976; Arai et al. Appl. Phys. B53:199, 1991; Clark et al. Appl. Phys. Lett. 32:46, 1978, each of which is incorporated herein by reference). Also, float zone segregation may be utilized for purification of a semiconductor.

Methods available for assembling isotopically pure materials into an isotope superlattice of the present invention include, for example, chemical vapor deposition (CVD), molecular beam epitaxy (MBE), and chemical beam epitaxy (CBE) (see, for example, Sedwick et al J. Vac Sci. Technol. A 10(4), 1992, incorporated herein by reference). Isotopically pure materials prepared by any available method, including those recited above, may be used in combination with standard CVD, MBE, or CBE technologies to produce an isotope superlattice of the present invention.

Additionally, an isotope superlattice of the present invention may be prepared by performing isotope separation and layer deposition simultaneously. In a particularly preferred embodiment of the present invention, the laser dissociation isotope separation technique is utilized in combination with a CVD process, (i.e. as a "laser-assisted CVD" process) in a single chamber, to produce an isotope superlattice of the present invention (see Example 18).

Examples 15–18 provide specific descriptions of fractional distillation, chemical exchange, laser dissociation, and laser-assisted CVD techniques, respectively. Fractional distillation can be utilized, for example, in the preparation of bulk precursors for epitaxial or Czochralski growth. Laser-assisted CVD provides in situ isotope separation and layer growth. These examples are descriptions of preferred embodiments, and are not intended to limit the scope of the invention as a whole.

EXAMPLE 15

Fractional Distillation

It is well known that there exist slight differences in the heat of vaporization of different isotopic species contained in a liquid. The method of fractional distillation provides, after processing, for one isotopic species to remain in the liquid phase while the other is drawn off in a vapor phase. A preferred method for the separation of silicon isotopes would be the fractional distillation of $SiCl_4$, a material which is liquid at room temperature but which provides a comparatively high vapor pressure. Since $SiCl_4$ is a standard precursor for production of both silane and elemental silicon, there is very little waste in this process.

EXAMPLE 16

Chemical Exchange

Chemical exchange provides separation between different isotopic species by virtue of isotopic differences in free energy and the corresponding influence on equilibrium chemical reactions. It has been shown that, under suitable circumstances, isotopic species will show different ratios in reactant and product mixtures for certain equilibrium reactions. The key requirements for such chemical exchange mechanisms to be effective are:

The use of immiscible reactant/product phases (immiscible liquids or liquid-gas reactions);

Electronic orbitals similar to the delocalized orbitals found in aromatic compounds; and An appropriate catalyst to speed the reaction to equilibrium.

EXAMPLE 17

Laser dissociation and isotope-selective heating

Laser dissociation and isotope-selective heating is the preferred method for in situ separation and growth of isotope-pure layers.

The laser dissociation technique of isotope separation relies on the fact that many molecules exhibit vibrational transitions in the near- to mid- infrared range. Bombarding molecules with radiation tuned to their vibrational transitions dissociates the molecules. Because the vibrational transitions of molecules are dependent on the masses of the atoms, molecules containing different isotopes of a given atom exhibit different transition energies. Thus, molecules containing different isotopes of a given atom are dissociated by bombardment with radiation of different frequencies.

A variety of laser sources are available with access to the near- to mid- infrared region, that could be used to dissociate molecules having vibrational transitions in that region. For example, transitions in the 9–10 $\mu$m range are accessible using a $CO_2$ laser; various solid state lasers can access the near-infrared; and optical parametric oscillator technology can be utilized to achieve wide tunability.

In order to separate one isotope of an atom from another using laser dissociation, a mixture of molecules including the different isotopes is bombarded with radiation (i.e. from a laser) tuned to the vibrational transition frequency of a first molecule including a first isotope. The first molecule therefore becomes excited and can be separated from other molecules in the mixture by virtue of its higher temperature, or its increased sensitivity to photodissociation (see below). After the first isotope has been isolated, the radiation frequency can be adjusted by, for example, tuning the laser to a new frequency or providing an alternate laser source, so that the radiation frequency is tuned to the vibrational transition frequency of a second molecule, including a second isotope, and that second molecule can be isolated. The procedure is repeated until all desired isotopes are isolated.

EXAMPLE 18

Laser-assisted CVD

A silicon isotope superlattice of the present invention may be produced by exposing silane ($SiH_4$) gas to infrared radiation in a chamber such as that depicted in FIG. 21. A wafer 300 is held in the chamber at a temperature below that required for spontaneous decomposition of silane. The wafer 300 may be positioned on a heater 350. A first laser 310 is tuned to the vibrational transition frequency of the first desired silicon isotope (e.g. $Si^{28}$). The laser excitation provides a large temperature differential between the desired isotope and the other isotopes, resulting in deposition of only the desired isotope on the wafer 300. Alternatively, the first laser 310 can be used to excite only the first desired silicon isotope, and a second laser 320 can provide a high energy photon to photoionize the excited silane molecules (i.e. those silane molecules containing the desired silicon isotope), producing ions that have high reactivity with the surface of the wafer 300.

After the appropriate number of atomic layers of the first silicon isotope have been laid down, the first laser 310 is adjusted and tuned to the vibrational transition frequency of the second desired silicon isotope (e.g. $Si^{30}$). The appropriate number of atomic layers of the second silicon isotope are then laid down. The process is reiterated until the desired isotope superlattice structure is produced.

After the growth of the isotope superlattice, calibration of layer thickness can be carried out through a SIMS analysis. Standard in situ monitoring (e.g. RHEED) can also be carried out to determine, for example, if the majority isotope layers grow at a dramatically faster rate than the minority isotope layers. If so, the disparity can be corrected, for example, by adjusting the laser power (e.g. lowering the laser power for depositing the majority isotope layers).

At all times during the growth of the isotope superlattice of the present invention, the temperature in the chamber should be high enough to maintain the surface mobility of deposited silicon atoms, in order to assure epitaxial growth. It is also preferred that the isotope superlattice be grown in the direction of the lowest conduction band minimum. For silicon, this corresponds to the (100)(010)(001) family of growth planes; for germanium, a (111) superlattice is desirable. Diamond has a band structure closer to that of silicon, and therefore requires similar growth directions. As would be apparent to one of ordinary skill in the art, other growth directions are possible, provided that the periodicity in the appropriate direction (e.g. in the (100) direction for silicon) meets the criteria discussed herein.

The isotope purity of an isotope superlattice of the present invention can be tested using any available method such as, for example, secondary ion mass spectroscopy or Raman scattering.

As will be appreciated by one of ordinary skill in the art, important requirements for production of an isotopically pure superlattice of the present invention include the requirement that the wafer 300 be atomically clean, that the switching of laser frequencies does not lead to deposition of "mixed" isotopic layers, and that the chamber provide a substantially collision-free environment.

Each of these requirements is discussed in turn. First of all, the wafer 300 can be cleaned using standard methods and oxide removal should be performed.

In order to avoid problems associated with mixed isotope populations produced during laser tuning, one particular embodiment of the method of the present invention provides a plurality of wafers 300 assembled onto a rotating carousel whose rotation is timed such that only pure isotope layers are deposited on wafers (i.e. so that mixed populations are produced during the times that gaps, instead of wafers, are exposed to the silane stream).

A substantially collision-free environment is ensured in the method of the present invention, as depicted in FIG. 21, by having the first 310 and second 320 lasers intersect at a point close to the surface of the wafer 300.

As will also be appreciated by one of ordinary skill in the art, it is desirable when practicing the preferred method of the present inventors to ensure that silicon layers are deposited preferentially if not uniquely, on the wafer 300, and not on other parts of the chamber. Thus, it is desirable that the infrared windows 330 and 340, through which the first and second laser beams are directed, be made of a material that will not be coated with silicon following the excitation.

OTHER EMBODIMENTS

The foregoing has provided a description of certain preferred embodiments of the present invention, which description is not meant to be limiting. Other embodiments of the present invention are within the scope of the following claims.

In particular, the present invention is not limited to semiconductor materials. Materials such as diamond may also be used. Additionally, a phonon resonator may be incorporated into any of a variety of other optical or electrical devices, as would readily be appreciated by one of ordinary skill in the art. For example, a phonon resonator may be incorporated into a superconducting quantum interference device (SQUID), a Josephson junction, a high frequency transistor, or a microwave detector, in order to enhance the electrical and/or thermal properties of those devices.

Also, the present specification describes a structure of periodically varying density (e.g. an isotope superlattice). The density of the preferred structure described above is varied by providing alternating layers of material of different mass density. Another way to periodically vary the mass density of a structure is to introduce a standing wave into the structure. However, because phonons normally only propagate 100–1000 Å without scattering, a sound wave having a wavelength of much less than 1000 Å would be required to establish the necessary standing wave. Such sound waves cannot practically be generated. Thus, the preferred embodiment of the structure of periodically varying density of the present invention is a structure having layers of material of different density, most preferably an isotope superlattice as described herein.

As will be apparent to one of ordinary skill in the art, a structure of periodically varying density such as that described herein could be designed to suppress, rather than to enhance, phonons of particular wavevectors. For example, it is sometimes desirable to avoid phonon-electron interactions that result in ionization of an electron bound in a quantum well or a quantum wire structure. A structure of the present invention can be assembled as described herein, having been designed not to be resonant for, and therefore to suppress, phonons at the energies required to ionize an electron. Such a structure would improved the performance of the quantum well or wire.

As will also be apparent to one of ordinary skill in the art, an isotope superlattice of the present invention could be constructed from isotopically enriched layers of two or more different elements or compounds, provided that the overall structure is designed to be resonant for phonons of appropriate wavevector to participate in phonon-electron interactions. For example, a structure could be assembled comprising two atomic layers of a carbon isotope alternating with three atomic layers of a silicon isotope. Such a structure would exhibit a large (greater than approximately 2.5 eV) indirect bandgap, and would be suitable for use in, for example, a light emitting device such as those described herein.

The above-described preferred embodiment of the method of the invention utilizes silane ($SiH_4$) as a starting material to produce a silicon isotope superlattice of the invention by laser-assisted isotope separation. Other starting materials could also be used such as, for example, $SiH_2Cl_2$, $SiF_4$, or any other member of the halide-silane family of gases, although heavier molecules such as dichlorosilane ($SiH_2Cl_2$) have complicated vibrational spectra, which makes identification of a vibrational absorption frequency that is clearly associated with a single silicon isotope is more difficult. Thus, for the purposes of the present invention, silane is the preferred source gas for laser-assisted isotope separation.

Also, while the Examples presented herein describe the fabrication and application of one dimensional phonon resonators, one of ordinary skill in the art would recognize that structures that are periodic in more than one (eg. in two or three dimensions can also be fabricated and used in accordance with the present teachings. Such structures provide resonances for phonons in up to three directions in the crystal. The method for determining the resonator period in two or three dimensions is precisely analogous to that used for one dimension. A three dimensional periodicity has the effect of modifying the phonon spectrum of the entire crystal rather than the phonon spectrum in one dimension.

I claim:

1. A silicon structure of substantially periodically varying density comprising:

at least one first layer that is substantially enriched for a first silicon isotope and has a first density; and at least one second layer that is substantially enriched for a second silicon isotope and has a second density, said first and second layers being adjacent one another and alternating in said structure so that said structure has a substantially periodically varying density in one dimension, the period of said structure being selected such that said structure is substantially resonant for phonons of appropriate wavevector to participate in electron-phonon interactions that change the interacting electron's momentum.

2. The structure of claim 1, further comprising at least one dopant.

3. The structure of claim 1 wherein said first isotope is $Si^{30}$ and said second isotope is $Si^{28}$.

4. The structure of claim 1 wherein said first isotope is $Si^{30}$ and said second isotope is $Si^{29}$.

5. The structure of claim 1 wherein said first isotope is $Si^{29}$ and said second isotope is $Si^{28}$.

6. The structure of claim 3 having a period that is an integer multiple of five atomic layers.

7. The structure of claim 1 wherein said structure provides a stochastic phonon resonance.

8. A structure of substantially periodically varying density comprising:

at least one first layer having a first density by virtue of being enriched for a first isotope of a first element; and at least one second layer having a second density by virtue of being enriched for a second isotope of a second element, said first and second regions being adjacent one another and alternating in said structure so that said structure has a substantially periodically varying density in one dimension the period of said structure being selected such that said structure is substantially resonant for phonons of appropriate wavevector to participate in radiative electronic transitions.

9. The structure of claim 8 wherein said first element and said second element are the same and said first isotope and said second isotope represent different isotopes of that element.

10. The structure of claim 9 wherein said element is an indirect bandgap material.

11. The structure of claim 9 wherein said element comprises silicon.

12. The structure of claim 11 wherein said first isotope is $Si^{30}$ and said second isotope is $Si^{28}$.

13. The structure of claim 12 having a period that is an integer multiple of five atomic layers.

14. The structure of claim 11 wherein said first isotope is $Si^{30}$ and said second isotope is $Si^{29}$.

15. The structure of claim 11 wherein said first isotope is $Si^{29}$ and said second isotope is $Si^{28}$.

16. A structure of substantially periodically varying density comprising:

at least one first region having a first density by virtue of being enriched for a first isotope of a first element; and at least one second region having a second density by virtue of being enriched for a second isotope of a second element, said first and second regions being adjacent one another and alternating in said structure so that said structure has a substantially periodically varying density, the period of said structure being selected such that said structure is substantially resonant for phonons generated by stimulated emission.

17. The structure of claim 16 wherein said phonons generated by stimulated emission are directional.

18. The structure of claim 17 wherein said phonons generated by stimulated emission are coherent.

19. The structure of claim 16 wherein said structure provides accelerated heat transfer.

20. The structure of claim 16 wherein said element has adjacent Brillouin zones.

21. The structure of claim 16 wherein said first element and said second element are the same and said first isotope and said second isotope represent different isotopes of that element.

22. The structure of claim 21 wherein said element comprises silicon.

23. The structure of claim 22 wherein said first isotope is $Si^{30}$ and said second isotope is $Si^{28}$.

24. The structure of claim 23 having a period that is an integer multiple of five atomic layers.

25. The structure of claim 22 wherein said first isotope is $Si^{30}$ and said second isotope is $Si^{29}$.

26. The structure of claim 22 wherein said first isotope is $Si^{29}$ and said second isotope is $Si^{28}$.

27. The structure of any one of claims 8 or 16 wherein said first element and said second element are different.

28. The structure of claim 27 wherein:

said first element comprises carbon;

said second element comprises silicon;

said at least one first layer comprises two atomic layers enriched for a first carbon isotope; and said at least one second layer comprises three atomic layers enriched for a first silicon isotope.

29. A silicon structure having:

degenerate conduction band valleys; and substantially periodic variations in material composition, said substantially periodic variations comprising alternations of a first layer substantially enriched for a first silicon isotope and a second layer substantially enriched for a second silicon isotope so that said material composition varies in one dimension, the periodicity of the layers being selected so that scattering of electrons between said degenerate conduction band valleys is enhanced relative to intervalley electron scattering in a structure lacking said substantially periodic variations.

30. The structure of claim 29 wherein said first isotope is $Si^{30}$ and said second isotope is $Si^{28}$.

31. The structure of claim 30, further including doping atoms produced by neutron transmutation of said $Si^{30}$.

32. The structure of claim 29 wherein said first isotope is $Si^{30}$ and said second isotope is $Si^{29}$.

33. The structure of claim 29 wherein said first isotope is $Si^{29}$ and said second isotope is $Si^{28}$.

* * * * *